US010981778B2

(12) United States Patent
Paci et al.

(10) Patent No.: US 10,981,778 B2
(45) Date of Patent: Apr. 20, 2021

(54) MEMS DEVICE COMPRISING A MEMBRANE AND AN ACTUATOR

(71) Applicant: STMicroelectronics S.R.L., Agrate Brianza (IT)

(72) Inventors: Dario Paci, Sedriano (IT); Domenico Giusti, Monza (IT); Irene Martini, Bergamo (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 16/752,321

(22) Filed: Jan. 24, 2020

(65) Prior Publication Data

US 2020/0156929 A1    May 21, 2020

Related U.S. Application Data

(63) Continuation of application No. 16/050,924, filed on Jul. 31, 2018, now Pat. No. 10,683,200.

(30) Foreign Application Priority Data

Aug. 7, 2017    (IT) .......................... 102017000091226

(51) Int. Cl.
*B81B 3/00*    (2006.01)
*H04N 5/232*    (2006.01)
(Continued)

(52) U.S. Cl.
CPC .......... *B81B 3/0024* (2013.01); *B81B 3/0021* (2013.01); *B81B 7/02* (2013.01);
(Continued)

(58) Field of Classification Search
None
See application file for complete search history.

(56) References Cited

U.S. PATENT DOCUMENTS

| 6,540,339 B2* | 4/2003 | Cruz-Uribe | ................ B41J 2/14 347/48 |
| 2007/0177245 A1 | 8/2007 | Kyoung | |

(Continued)

FOREIGN PATENT DOCUMENTS

| EP | 2 423 729 A1 | 2/2012 |
| WO | 2011/033028 A1 | 3/2011 |

OTHER PUBLICATIONS

Cazorla et al., "Piezoelectric micro-pump with PZT thin film for low consumption microfluidic devices," Procedia Engineering 87 (2014) 488-491.

(Continued)

*Primary Examiner* — Michelle Mandala
(74) *Attorney, Agent, or Firm* — Seed IP Law Group LLP

(57) ABSTRACT

A MEMS device includes a semiconductor support body having a first cavity, a membrane including a peripheral portion, fixed to the support body, and a suspended portion. A first deformable structure is at a distance from a central part of the suspended portion of the membrane and a second deformable structure is laterally offset relative to the first deformable structure towards the peripheral portion of the membrane. A projecting region is fixed under the membrane. The second deformable structure is deformable so as to translate the central part of the suspended portion of the membrane along a first direction, and the first deformable structure is deformable so as to translate the central part of the suspended portion of the membrane along a second direction.

20 Claims, 17 Drawing Sheets

(51) Int. Cl.
*H04N 5/225* (2006.01)
*B81B 7/02* (2006.01)
(52) U.S. Cl.
CPC ....... *H04N 5/2257* (2013.01); *H04N 5/23212* (2013.01); *B81B 2201/032* (2013.01); *B81B 2201/047* (2013.01); *B81B 2203/0127* (2013.01); *B81B 2203/0172* (2013.01); *B81B 2203/0315* (2013.01); *B81B 2203/04* (2013.01); *B81B 2203/053* (2013.01)

(56) References Cited

U.S. PATENT DOCUMENTS

| | | | |
|---|---|---|---|
| 2010/0232043 | A1 | 9/2010 | Hishinuma |
| 2011/0261252 | A1* | 10/2011 | Chen .................. H04N 5/23212 348/349 |
| 2012/0270352 | A1* | 10/2012 | Huffman ................ H02N 1/002 438/50 |
| 2017/0073215 | A1 | 3/2017 | Bergeron et al. |
| 2017/0325025 | A1 | 11/2017 | Dorfmeister et al. |

OTHER PUBLICATIONS

Ebermann et al., "Tunable MEMS Fabry-Pérot filters for infrared microspectrometers: A review," MOEMS and Miniaturized Systems XV, Proc. of SPIE vol. 9760, 2016, 20 pages.
PiezoMEMS2014, 4th International Workshop on Piezoelectric MEMS, Program (Version 2.3), Kobe University, Kobe, Japan, Oct. 28-29, 2014; 74 pages.
Tofteberg et al., CIMTEC 2014, 13th International Ceramics Congress, Montecatini Terme, Italy, Jun. 8-13, 2014; 16 pages.

* cited by examiner

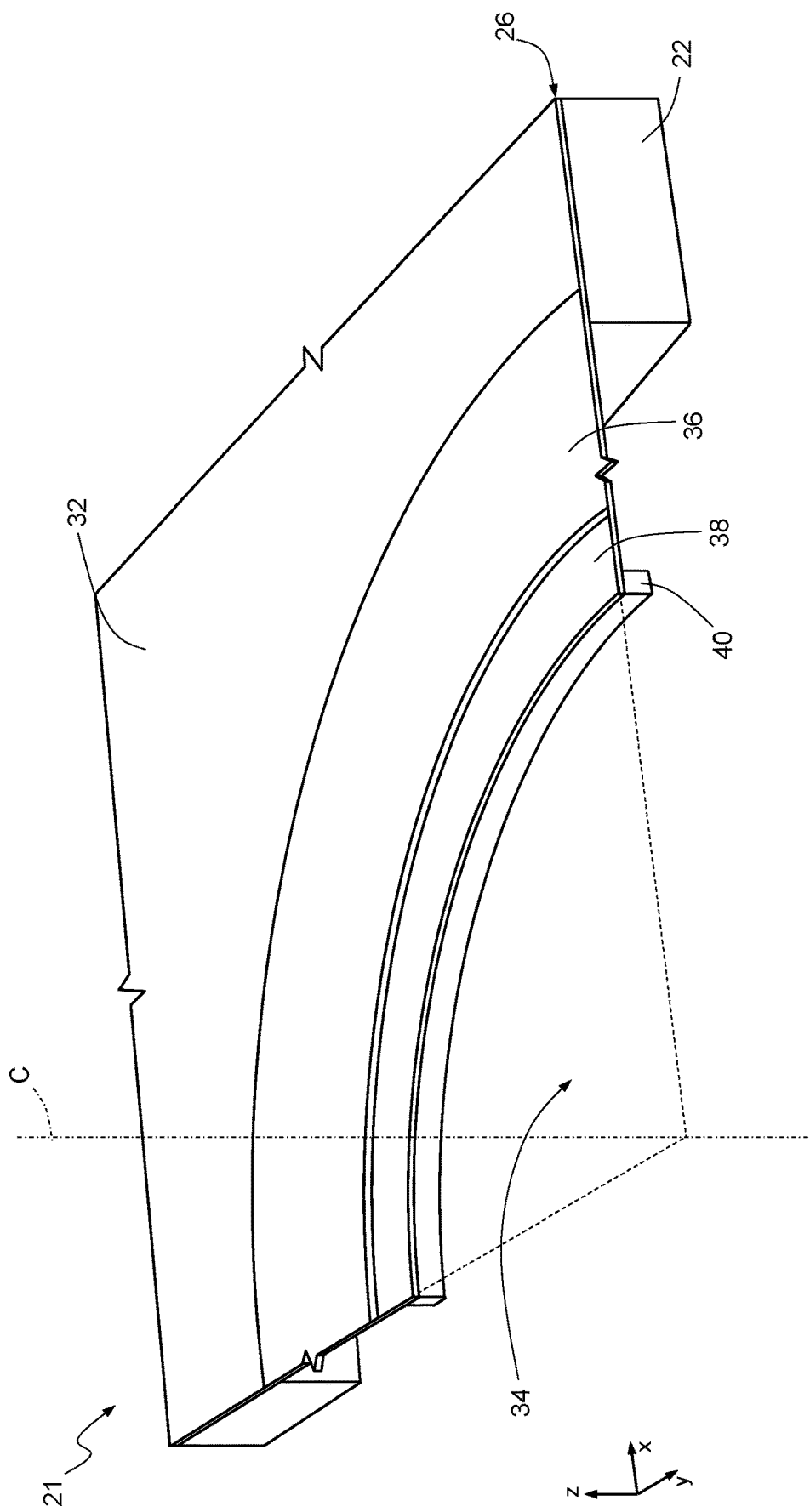

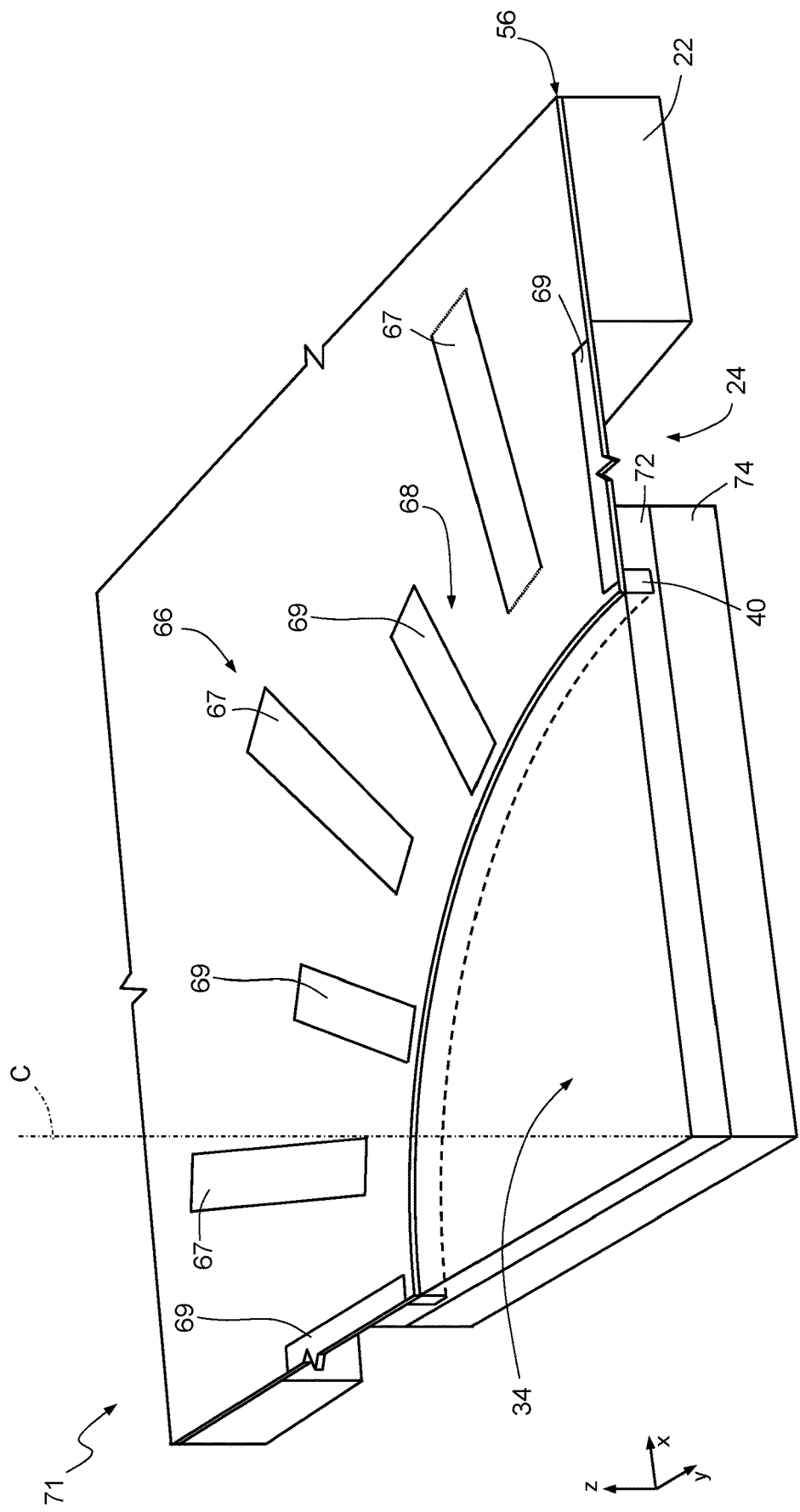

MEMS DEVICE COMPRISING A MEMBRANE AND AN ACTUATOR

BACKGROUND

Technical Field

The present disclosure relates to a microelectromechanical ("Micro ElectroMechanical Systems", MEMS) device including a membrane and an actuator capable of controlling the curvature of the membrane.

Description of the Related Art

There are known MEMS actuators made, at least partially, of semiconductor materials. Such microelectromechanical actuators enable a form of energy of a different type to be converted to mechanical energy. In particular, there are known piezoelectrically actuated MEMS devices, in which thin layers of piezoelectric material extend above a suspended portion of the MEMS device, for example a cantilever or a membrane. The application of an electrical field to the piezoelectric layer creates a stress on the piezoelectric layer and a consequent elastic deformation of the suspended portion of the MEMS device.

In MEMS devices of this type, the initial position of the suspended portion, that is to say the position assumed by the suspended portion in the absence of electrical fields applied to the piezoelectric layer, is difficult to control, owing to the presence of residual stresses which appear at the end of the process of manufacturing the MEMS device.

For various applications of these MEMS devices, such as radio frequency switches ("RF switches") or optical devices with reconfigurable-focus lenses, it is preferable for this suspended portion, in the absence of external electrical fields applied to the corresponding piezoelectric layer, to be in a known initial position defined at the design stage, for example the position that would be assumed in the absence of residual stresses.

For example, in the case of radio frequency switches, the suspended portion may be deformable so as to open or close an electrical connection in a circuit in a known way, by the application of a voltage control signal; an undesired change in the initial position of the suspended portion due to residual stress means that the voltage required to create the elastic deformation of the suspended portion required to open or close the electrical connection is different from the voltage defined at the design stage. For example, the required voltage might be greater than the voltage specified at the design stage; the required voltage might even be greater than the maximum voltage that can be applied to the suspended portion, in which case it would be impossible to provide the desired electrical connection.

FIGS. 1 and 2A show schematically an optical device 1 of a known type, viewed from above, and an orthogonal reference system formed by three axes x, y, z.

The optical device 1 has cylindrical symmetry with respect to an optical axis O.

The optical device 1 is based on a piezoelectrically actuated MEMS device of a known type, which comprises a moving portion 2 and a piezoelectric actuator 4 extending above the moving portion 2 and in contact with the moving portion 2. The moving portion 2 comprises a layer of glass, for example silicon dioxide ($SiO_2$). The piezoelectric actuator 4 comprises a piezoelectric layer, made of lead zirconate titanate (PZT) for example. In particular, the moving portion 2 has an aperture 3, of circular shape for example, extending through the whole thickness of the moving portion 2.

The moving portion 2 extends above a first support body 6, made for example of semiconductor material, particularly silicon. A peripheral region of the moving portion 2 is fixed to the first support body 6, while a central region of the moving portion 2 adheres to a microlens 8 of polymer material, which is soft (and therefore deformable) and transparent. In particular, the microlens 8 extends under the central region of the moving portion 2. The microlens 8 is, for example, circular in shape when viewed from above. A second support body 10, made of silicon dioxide for example, is mechanically coupled to the microlens 8 and extends under the microlens 8. The second support body 10 is, for example, circular in shape when viewed from above.

When the optical device 1 is in use, an optical signal 12, for example a beam of light parallel to the optical axis O, can pass through the second support body 10, the microlens 8 and the aperture 3. The microlens 8 enables the light beam to be focused at a desired distance, depending on the shape of the microlens 8.

In use, the application of a voltage to the piezoelectric actuator 4 creates a tensile stress on the piezoelectric layer and consequently deforms the moving portion 2; in its turn, the deformation of the moving portion 2 causes a deformation of the microlens 8. It is therefore possible to modify the focal length of the microlens 8 by means of a voltage control signal supplied to the optical device 1.

With particular reference to FIG. 2A, this shows the optical device 1 in a first operating condition, in which an upper face 8' of the microlens 8 is perpendicular to the optical axis O. The microlens 8 is therefore focused on infinity; thus if the optical signal 12 is formed by optical rays parallel to the optical axis O, this passes through the microlens 8 without being deflected.

The optical device 1 can therefore be used, for example, for implementing automatic focusing ("autofocus") functions using known methods of feedback to the voltage control signal of the piezoelectric actuator 4. In this context, in order to ensure correct operation of the autofocus process, it is usually desirable for the moving portion 2, in the absence of a voltage control signal applied to the piezoelectric actuator 4, to extend parallel to the plane xy, without creating deformations in the microlens 8 and therefore acting in such a way that the microlens 8 has a theoretically infinite focal length (as in FIG. 2A); alternatively, some photographic lens manufacturers prefer to have the moving portion 2 extending with a downward curve as the distance from the optical axis O decreases, so as to create a deformation in the microlens 8 such that the microlens 8 has a refractive power of −2 diopters.

Unfortunately, owing to the presence of residual stress in the moving portion 2 at the end of the process of manufacturing the optical device 1 based on known MEMS manufacturing methods, the initial position of the moving portion 2, in the absence of a voltage control signal applied to the piezoelectric actuator 4, may differ from the preferred initial position. For example, the initial position of the moving portion 2 may be such that the moving portion 2 extends with an upward curve as the distance from the optical axis O decreases, as shown in FIG. 2B. In particular, FIG. 2B refers to the case in which the moving portion 2 is subject to an initial stress $\sigma_i$.

In greater detail, the upper face 8' of the microlens 8 has an upwardly facing convexity. Consequently, if the optical signal 12 is formed by optical rays parallel to the optical axis O, it is focused on the focus of the microlens 8, which is at a distance $f_1$ from the microlens 8, this distance $f_1$ being measured parallel to the axis z. Thus the stress within the moving portion 2 acts in such a way that the initial shape of the moving portion 2 is not of the desired type described above.

A drawback of the prior art is that the piezoelectric actuator 4, being based on a piezoelectric layer of PZT, is of the unimorphous type, and is therefore subject to a tensile stress which is independent of the sign of the applied voltage. In particular, regardless of whether the voltage applied to the piezoelectric actuator 4 is positive or negative, the piezoelectric actuator 4 is subject to a tensile stress inducing the same type of deformation of the moving portion 2 and the accompanying curvature of the microlens 8.

In this context, FIG. 2C shows the optical device 1 when the moving portion 2 is still subject to the aforementioned initial stress $\sigma_i$, and furthermore a non-zero voltage V is applied to the piezoelectric actuator 4. The voltage V causes a greater upward curvature of the moving portion 2 and a greater curvature of the convexity of the microlens 8, resulting in a reduction of the focal length of the microlens 8, which assumes a value of $f_2 < f_1$.

In practice, it is impossible to apply a voltage to the piezoelectric actuator 4 such that the moving portion 2 is brought into a desired initial position to implement the autofocus function, particularly if the moving portion 2 has to be curved downwards in order to reach the desired position. There is therefore a need to provide a solution that overcomes at least some of the drawbacks of the prior art.

BRIEF SUMMARY

According to the present disclosure, therefore, a MEMS device including a membrane and an actuator capable of controlling the curvature of the membrane in multiple directions is provided.

BRIEF DESCRIPTION OF THE SEVERAL VIEWS OF THE DRAWINGS

To enable the present disclosure to be understood more readily, preferred embodiments will now be described, purely by way of non-limiting example, with reference to the attached drawings, in which:

FIG. 3C shows a perspective view from above of a portion of the MEMS device of FIGS. 3A and 3B;

FIG. 7 shows a perspective view from above of a portion of an optical device including the present MEMS device according to an embodiment of the present disclosure;

DETAILED DESCRIPTION

The applicant has observed that a possible solution for curving a moving portion downwards is that of providing a piezoelectric actuator, made of PZT for example, above a central part of the moving portion. However, if this is done, the central part of the moving portion is occupied by the actuator itself; this fact makes this solution unsuitable for applications in which, for example, the central part of the moving portion must allow the passage of radiation, or in any case must have specific characteristics (of conductivity, for example) which are incompatible with the presence of the actuator. The present MEMS device was therefore inspired by these observations.

Figure 3A:
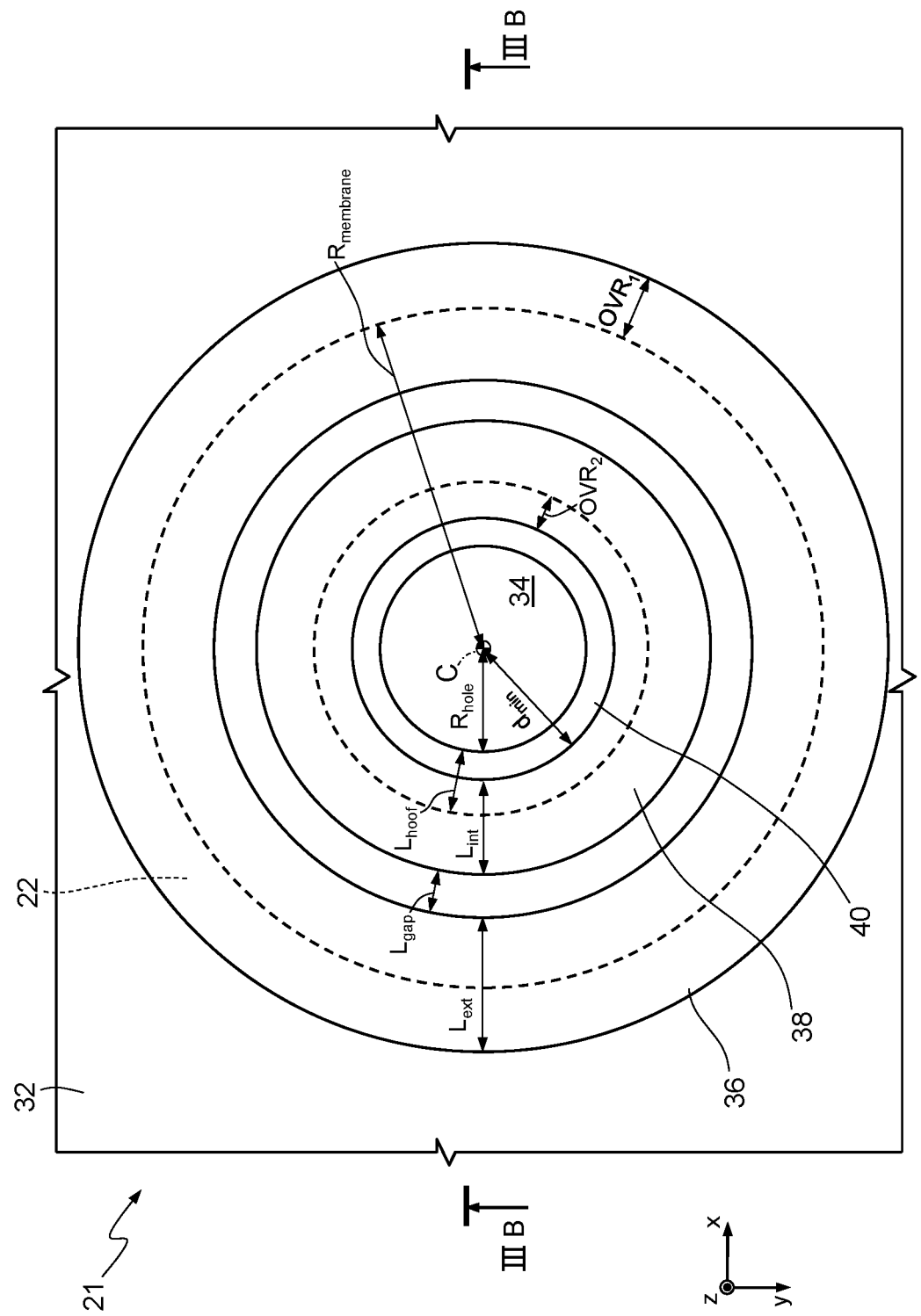
FIG. 3A shows schematically, and not to scale, in a view from above with portions removed, a MEMS device according to one embodiment of the present disclosure.
Figure 3B:
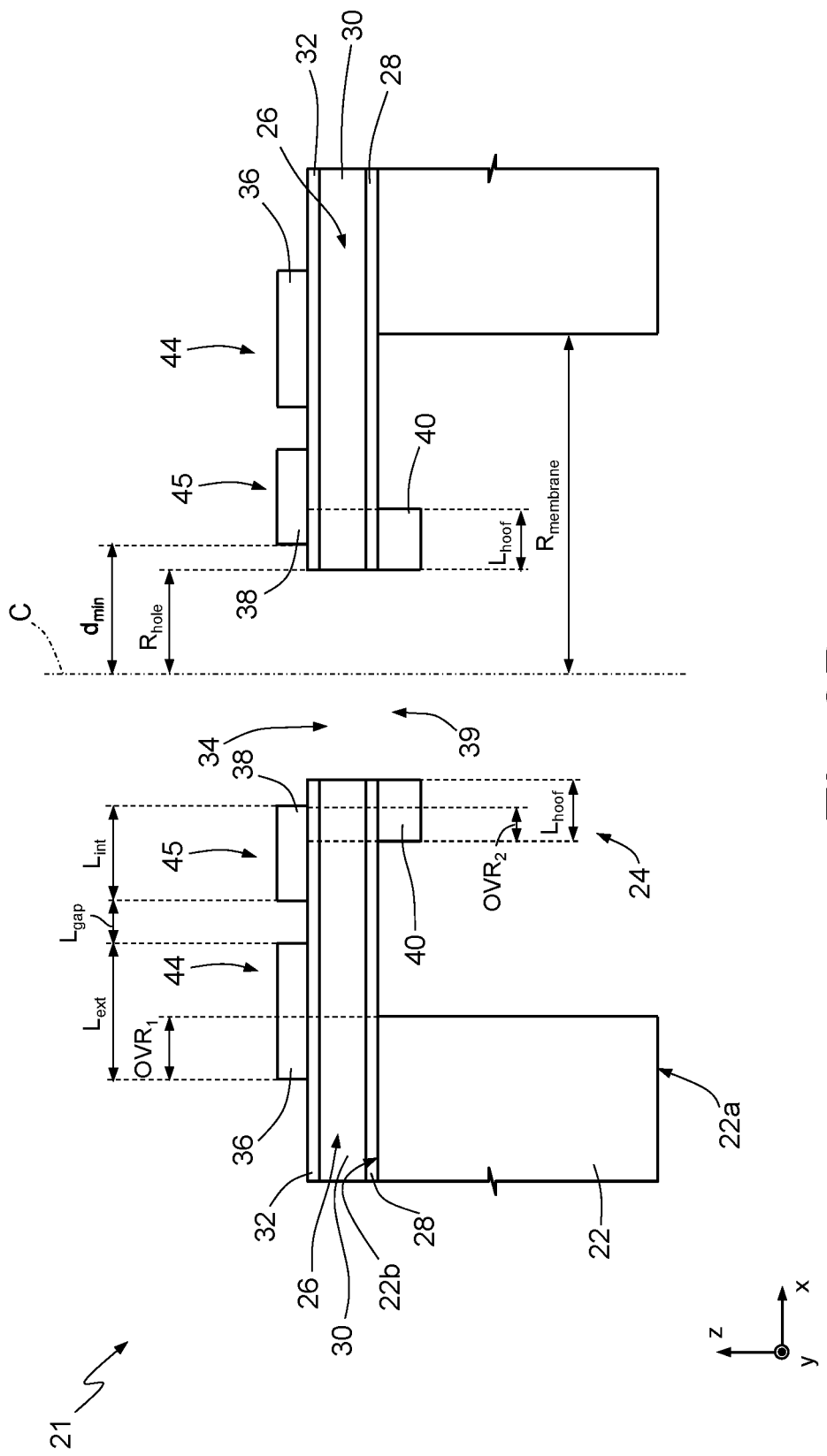
FIG. 3B shows schematically, and not to scale, a cross-sectional view of the MEMS device of FIG. 3A taken along a section line IIIB-IIIB of FIG. 3A.

In detail, FIGS. 3A-3C show a MEMS device 21 which comprises a support body 22, made for example of semiconductor material such as silicon. The support body 22 is delimited by a lower surface 22a and an upper surface 22b. The lower surface 22a and the upper surface 22b are parallel to the plane xy. The upper surface 22b extends above the lower surface 22a, at a distance from the lower surface 22a of between 50 μm and 720 μm, for example.

The support body 22 delimits a cavity 24 of cylindrical shape. The cavity 24 extends through the whole thickness of the support body 22 and has cylindrical symmetry with respect to an axis C parallel to the axis z. The cavity 24 has a radius $R_{membrane}$ of between 0.5 mm and 20 mm, for example.

A membrane 26 extends above the support body 22. In particular, a peripheral portion of the membrane 26 is fixed to the upper surface 22b; however, a central portion of the membrane 26 is suspended over the cavity 24.

In detail, the membrane 26 is formed by a first dielectric layer 28, a first structural layer 30 and a second dielectric layer 32.

The first dielectric layer 28 extends above the upper surface 22b, in direct contact with the support body 22. In detail, the first dielectric layer 28 includes a respective peripheral portion, which is fixed to the support body 22, and in particular to a portion of the support body 22 that laterally delimits the cavity 24.

The first structural layer 30 extends, in direct contact, on the first dielectric layer 28. Additionally, the second dielectric layer 32 extends, in direct contact, on the first structural layer 30.

The first dielectric layer 28 is made of insulating material, for example silicon dioxide produced by thermal growth, silicon nitride, silicon carbide or silicon oxynitride, and has a thickness of between 1 μm and 50 μm, for example.

The first structural layer 30 is made of semiconductor material, for example silicon, or insulating material, for example BPSG ("borophosphosilicate glass") or USG ("undoped silicon glass"), and has a thickness of between 1 μm and 100 μm, for example.

The second dielectric layer 32 is made of insulating material, for example silicon dioxide produced by thermal growth, and has a thickness of between 1 μm and 50 μm, for example.

The membrane 26 has an aperture 34 which is of cylindrical shape and is positioned symmetrically with respect to the axis C. The aperture 34 extends through the whole thickness of the membrane 26 and has a radius $R_{hole}$ of between 0.2 mm and 15 mm, for example.

The MEMS device 21 comprises a first piezoelectric region 36, which is referred to below as the outer piezoelectric region 36. The MEMS device 21 also comprises a second piezoelectric region 38, which is referred to below as the inner piezoelectric region 38.

As described in greater detail below, the outer piezoelectric region 36 and the inner piezoelectric region 38 form, respectively, an outer deformable structure or actuator 44 and an inner deformable structure or actuator 45. Additionally, for simplicity of visualization, FIGS. 3A and 3B show only the respective piezoelectric region for each of the outer actuator 44 and the inner actuator 45. For this reason, the arrangement of each of the outer piezoelectric region 36 and the inner piezoelectric region 38 relative to the other parts of the MEMS device 21 is purely qualitative.

The outer piezoelectric region 36 is formed of PZT. The outer piezoelectric region 36 also takes the form of a hollow cylinder, and extends above the membrane 26, to which it is mechanically coupled as described in greater detail below.

In greater detail, the outer piezoelectric region 36 extends partially above the peripheral portion of the membrane 26, and therefore above the support body 22; the outer piezoelectric region 36 also extends partially over the central portion of the membrane 26, and therefore over the cavity 24.

The outer piezoelectric region 36 has cylindrical symmetry with respect to the axis C, and also, when viewed from above, has a length $L_{ext}$ of between 1.5 μm and 3 mm for example, where the length $L_{ext}$ is defined as the difference between the radius of the outer circumference and the radius of the inner circumference of the outer piezoelectric region 36. The outer piezoelectric region 36 also has a thickness of between 0.5 μm and 10 μm, for example.

In practice, when viewed from above, the support body 22 and the outer piezoelectric region 36 overlap in a circular ring-shaped region having a length OVR1 of between 0.5 μm and 20 μm, for example.

In other embodiments, not shown, the outer piezoelectric region 36 does not overlap the support body 22; in particular, the lateral wall of the outer piezoelectric region 36 farthest from the axis of symmetry C may be aligned along the axis z at the wall of the cavity 24; alternatively, this lateral wall may be laterally offset towards the axis of symmetry C relative to the wall of the cavity 24, at a radial distance of between 0.5 μm and 2 μm from the wall of the cavity 24. However, the arrangement of the outer piezoelectric region 36 according to the embodiment of FIG. 3B provides greater piezoelectric actuation efficiency.

As regards the inner piezoelectric region 38, this is formed of PZT. The inner piezoelectric region 38 also takes the form of a hollow cylinder and extends above the membrane 26, to which it is mechanically coupled as described in greater detail below.

In greater detail, the inner piezoelectric region 38 extends entirely above the central portion of the membrane 26. Additionally, the inner piezoelectric region 38 has cylindrical symmetry with respect to the axis C, and, when viewed from above, has a length $L_{int}$ of between 1.5 μm and 3 mm for example. The inner piezoelectric region 38 also has a thickness of between 0.5 μm and 10 μm, for example.

In practice, the inner piezoelectric region 38 is surrounded by the outer piezoelectric region 36 and is positioned at a distance from the latter. In greater detail, the inner piezoelectric region 38 and the outer piezoelectric region 36 are arranged so as to be spaced apart radially at a distance $L_{gap}$ of between 0.5 μm and 500 μm, for example.

The lengths of the outer piezoelectric region 36 and the inner piezoelectric region 38 are, for example, selected in such a way that the inner piezoelectric region 38 is at a radial distance from the axis of symmetry C (this distance being measured between the axis of symmetry C and the nearest point of the inner piezoelectric region 38) equal to at least a minimum distance $d_{min}$, where $d_{min}$ is, for example, equal to two thirds of the radius $R_{membrane}$ of the cavity 24. Therefore the following relation, for example, is true:

$$L_{ext}+L_{gap}+L_{int}-OVR_1<\tfrac{1}{3}R_{membrane}$$

In this context, the applicant has observed that the aforementioned relation allows a correct bimorphous embodiment of the present MEMS device, while also making it possible to define a central part of the membrane 26 which is free of the presence of actuators and may be used, for example, to form an aperture for an optical device or to provide an electrical contact.

The MEMS device 21 further comprises a second structural layer 40, which extends under the membrane 26, to which it is mechanically coupled. The second structural layer 40 is referred to below by the term "projecting region" 40.

The projecting region 40 takes the form of a hollow cylinder and has cylindrical symmetry with respect to the axis C. The projecting region 40 also has a length $L_{hoof}$ of between 0.1 μm and 10 mm, for example. The projecting region 40 is made of semiconductor material, for example silicon, or insulating material, for example BPSG or USG, and has a thickness of between 10 μm and 400 μm, for example.

When viewed from above, the projecting region 40 and the inner piezoelectric region 38 partially overlap in a circular ring-shaped region having a length OVR2 of between 0.1 μm and 50 μm, for example. The projecting region 40 also projects laterally with respect to the inner piezoelectric region 38 towards the axis of symmetry C. Conversely, when viewed from above, the projecting region 40 and the outer piezoelectric region 36 are spaced apart radially so as not to overlap.

In practice, the projecting region 40 delimits a corresponding cavity 39, referred to below as the secondary cavity 39. Additionally, without any loss of generality, the secondary cavity 39 is aligned with the aperture 34; the lateral walls of the secondary cavity 39 and of the aperture 34 are also vertically aligned. In other words, when viewed from above, the secondary cavity 39 and the aperture 34 have the same shape. However, there are possible embodiments (not shown) in which, for example, the projecting region 40 is set back or projecting with respect to the aperture 34.

Figure 4:
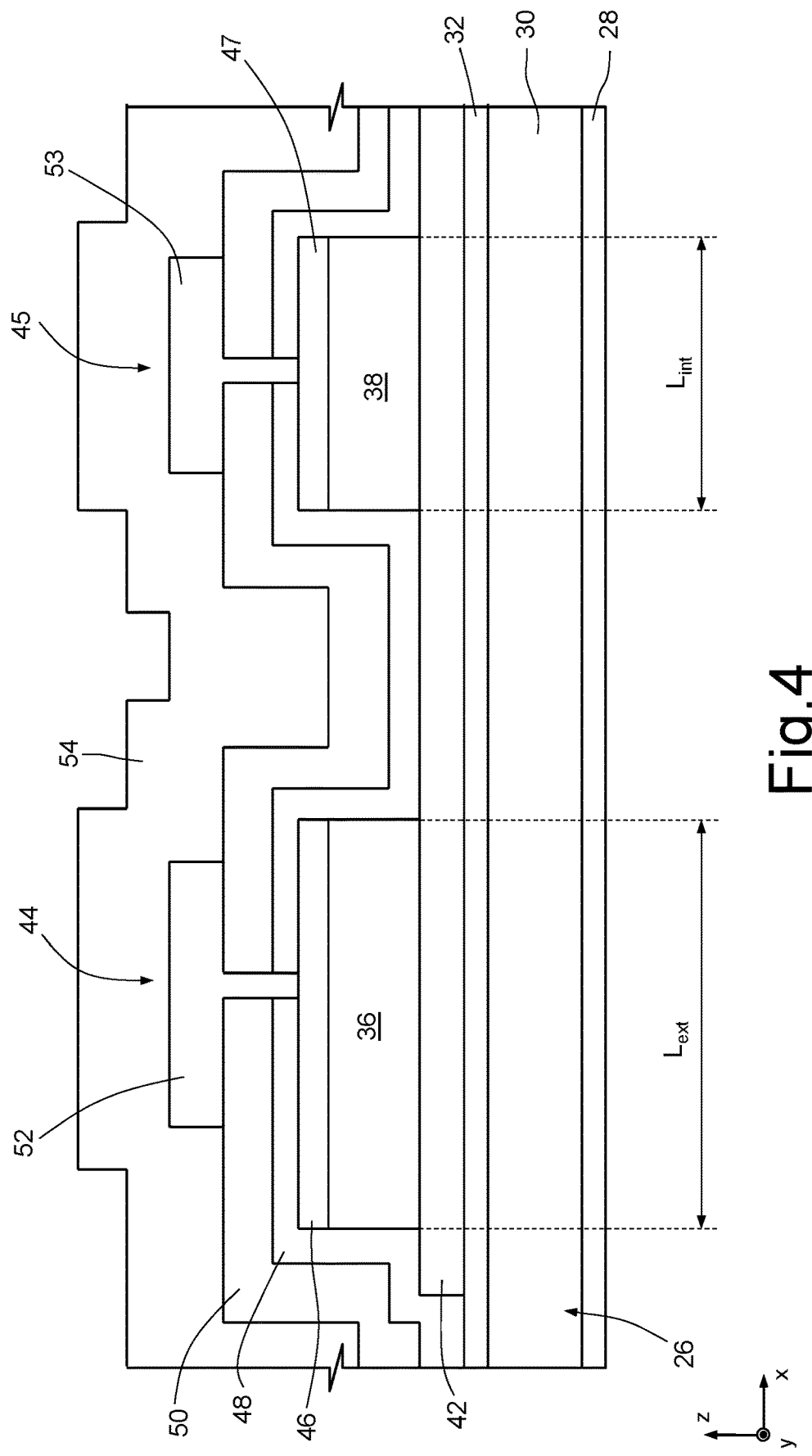
FIG. 4 shows schematically, and not to scale, another cross-sectional view of a portion of the MEMS device of FIGS. 3A-3C, taken along the section line IIIB-IIIB of FIG. 3A.

As shown in FIG. 4, the MEMS device 21 further comprises a first metallic layer 42, which extends above the second dielectric layer 32 of the membrane 26.

The first metallic layer 42 is made of conductive material, for example platinum or iridium oxide, and has a thickness of between 0.01 µm and 1 µm, for example. The outer piezoelectric region 36 and the inner piezoelectric region 38 are positioned above the first metallic layer 42, with which they are in direct contact. The first metallic layer 42 also acts as a lower electrode of the outer actuator 44 and of the inner actuator 45.

The MEMS device 21 further comprises a second and a third metallic layer 46, 47. The second metallic layer 46 extends above the outer piezoelectric region 36, with which it is in direct contact. The third metallic layer 47 extends above the inner piezoelectric region 38, with which it is in direct contact.

The second and the third metallic layer 46, 47 are made of conductive material, for example a tungsten-titanium alloy (TiW), ruthenium, platinum or iridium, and has a thickness of between 0.01 µm and 1 µm, for example. The second and the third metallic layer 46, 47 therefore act as an upper electrode for the outer actuator 44 and the inner actuator 45 respectively.

The MEMS device 21 further comprises a third dielectric layer 48 and a fourth dielectric layer 50. The third dielectric layer 48 extends above the second and the third metallic layer 46, 47, and above the surface of the first metallic layer 42 left exposed by the outer piezoelectric region 36 and by the inner piezoelectric region 38. The third dielectric layer 48 also covers the sides of the outer piezoelectric region 36, the inner piezoelectric region 38, the second metallic layer 46 and the third metallic layer 47.

The fourth dielectric layer 50 extends above the third dielectric layer 48. The third dielectric layer 48 is made of insulating material, for example USG, silicon nitride, aluminum nitride or aluminum oxide, and has a thickness of between 0.01 µm and 2 µm, for example. The fourth dielectric layer 50 is made of insulating material, for example USG, silicon nitride, aluminum nitride or aluminum oxide, and has a thickness of between 0.01 µm and 4 µm, for example.

The outer actuator 44 and inner actuator 45 further comprise a fourth and a fifth metallic layer 52, 53, which extend above the fourth dielectric layer 50. The fourth and the fifth metallic layer 52, 53 also pass through the third and the fourth dielectric layer 48, 50 until they come into contact with the second and third metallic layer 46, 47, respectively. Each of the fourth and fifth metallic layer 52, 53 is made of conductive material, for example aluminum, copper or gold, and has a thickness of between 0.01 µm and 10 µm, for example. The first metallic layer 42, the fourth metallic layer 52 and the fifth metallic layer 53 are connected to respective pads which are not shown in the drawings, so as to enable voltage control of the outer actuator 44 and the inner actuator 45 to be provided in use.

The MEMS device 21 further comprises a passivation layer 54, which extends above the fourth dielectric layer 50 and above the fourth and fifth metallic layer 52, 53. The passivation layer 54 is made of insulating material, for example silicon nitride, aluminum nitride or aluminum oxide, and has a thickness of between 0.01 µm and 4 µm, for example. The passivation layer 54 acts as a moisture barrier. In other embodiments, not shown, the passivation layer 54 may be absent.

In use, the application of a voltage between the lower electrode and the upper electrode of the outer actuator 44 induces a tensile stress on the outer piezoelectric region 36; additionally, the application of a voltage between the lower electrode and the upper electrode of the inner actuator 45 induces a tensile stress on the inner piezoelectric region 38. Thus a deformation of the membrane 26 is caused, as detailed further below.

Figure 5A:
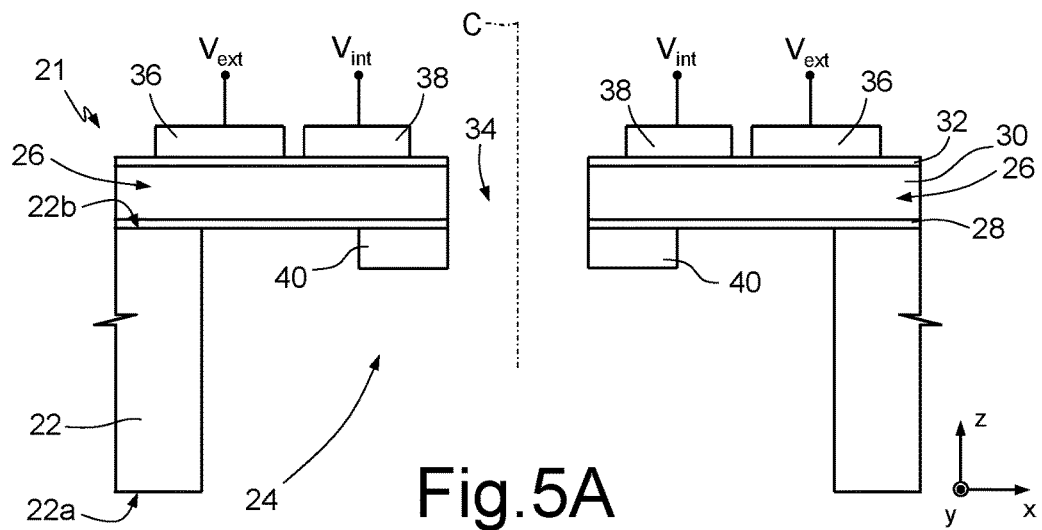
FIGS. 5A-5C show schematically, and not to scale, cross-sectional views of the optical device shown in FIG. 3A, in corresponding operating conditions, these sections being taken along the section line IIIB-IIIB of FIG. 3A.
Figure 5B:
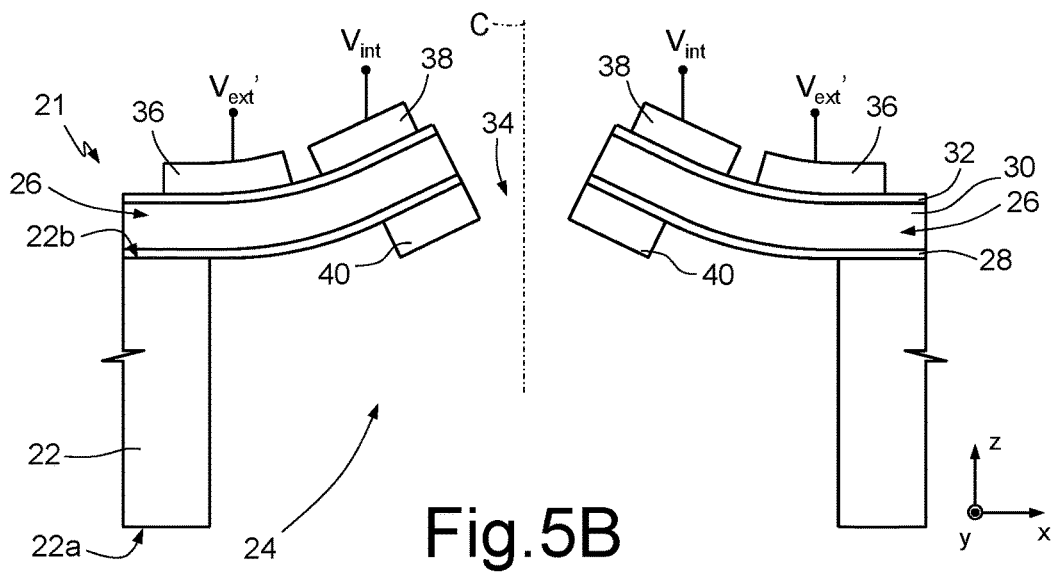
Figure 5C:
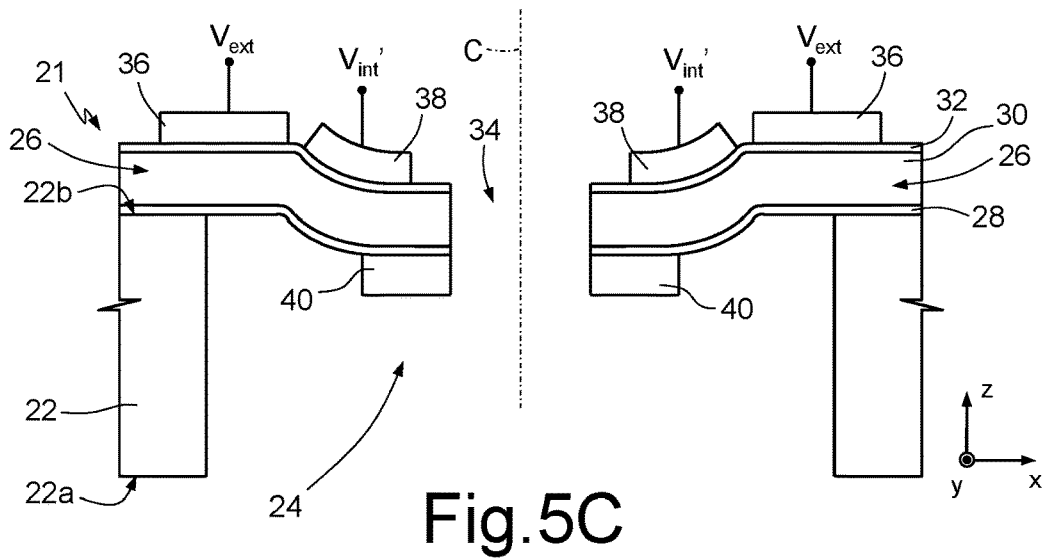

FIGS. 5A-5C show the MEMS device 21 in respective operating configurations. In particular, FIG. 5A shows a situation in which the outer piezoelectric region 36 is biased with a voltage signal having a value of Vert, while the inner piezoelectric region 38 is biased with a voltage signal having a value of $V_{int}$. The voltage values $V_{ext}$ and $V_{int}$ are such as to cancel out the stress within the membrane 26, so that the membrane 26 extends parallel to the plane xy.

Figure 1:
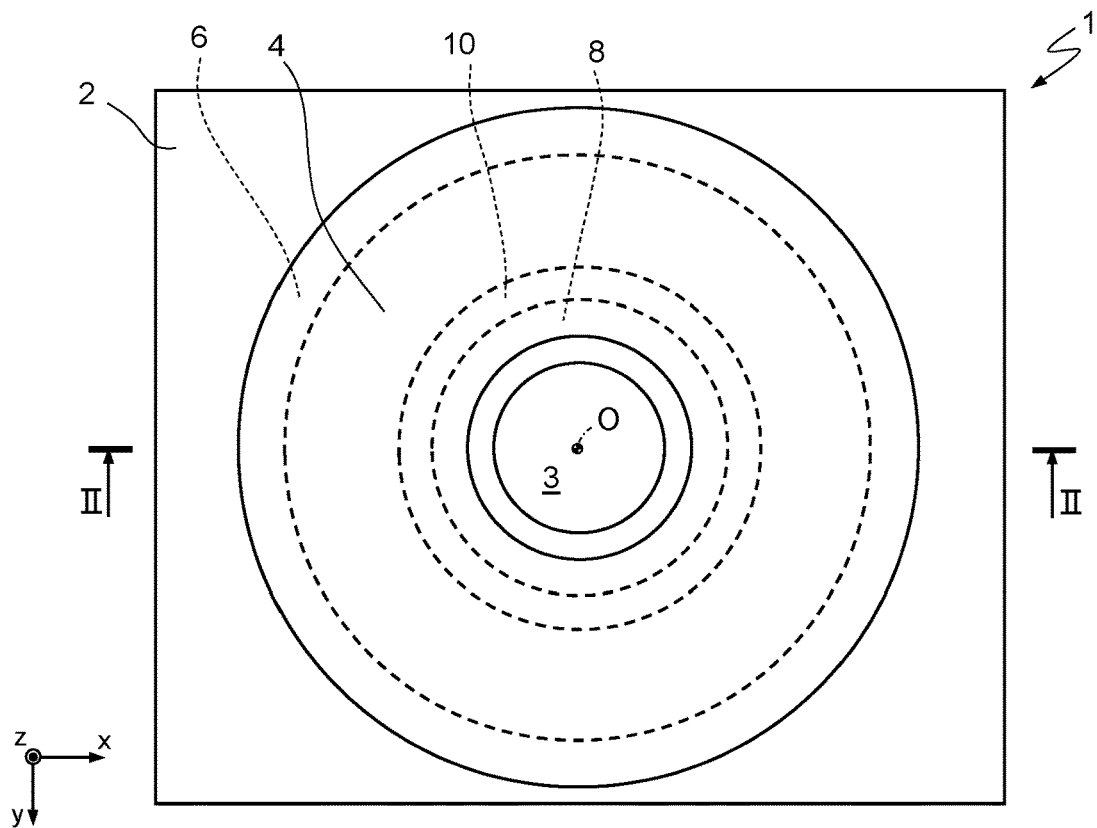
FIG. 1 shows schematically, in a view from above, an optical device of a known type.
Figure 2A:
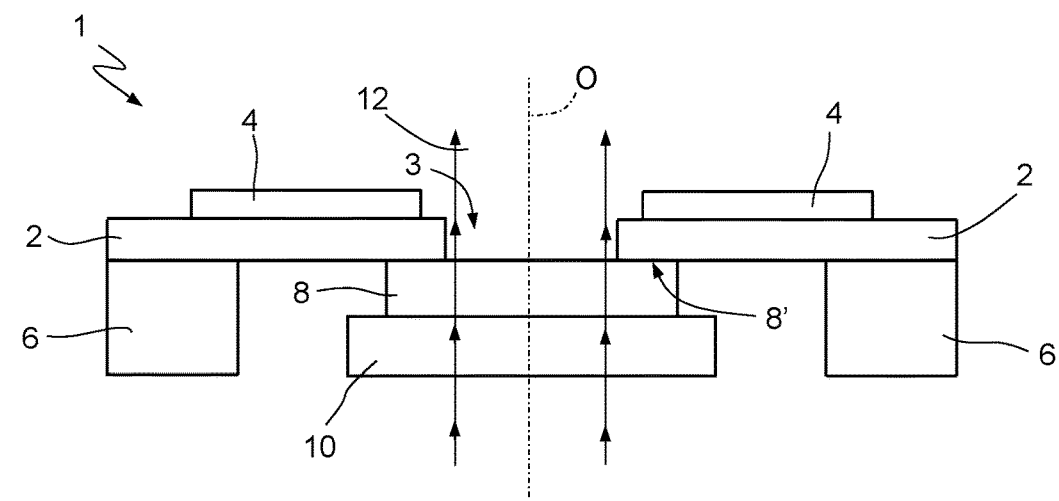
FIGS. 2A-2C show schematically cross-sectional views of the optical device shown in FIG. 1 in respective operating conditions, these sections being taken along a section line II-II of FIG. 1.
Figure 2B:
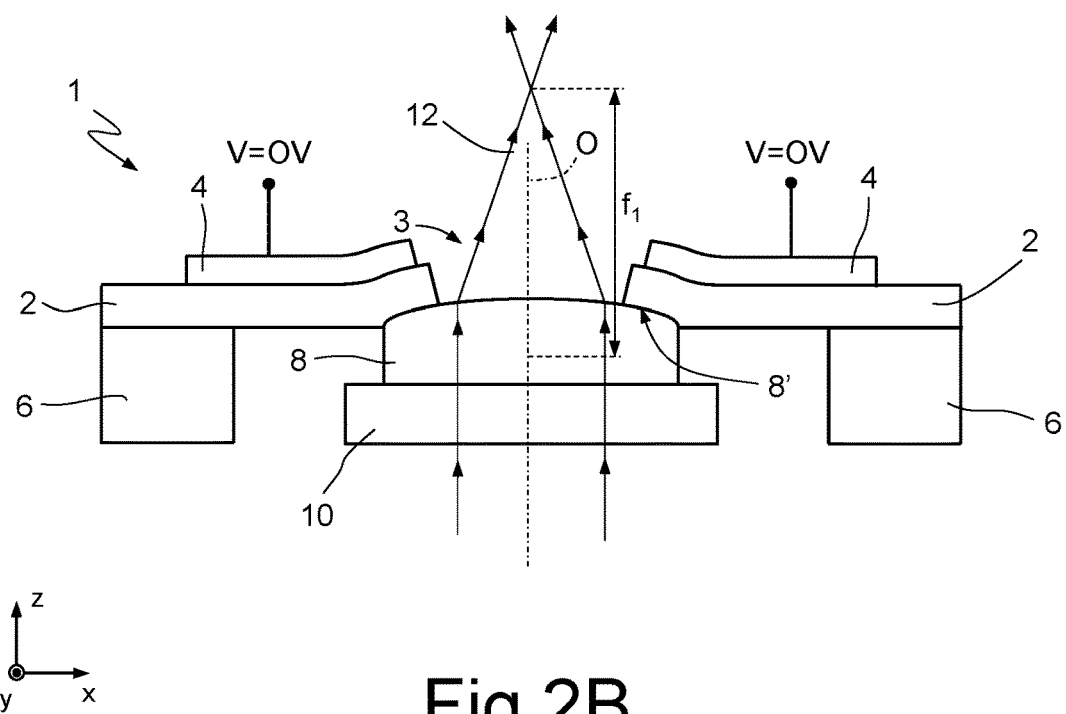
Figure 2C:
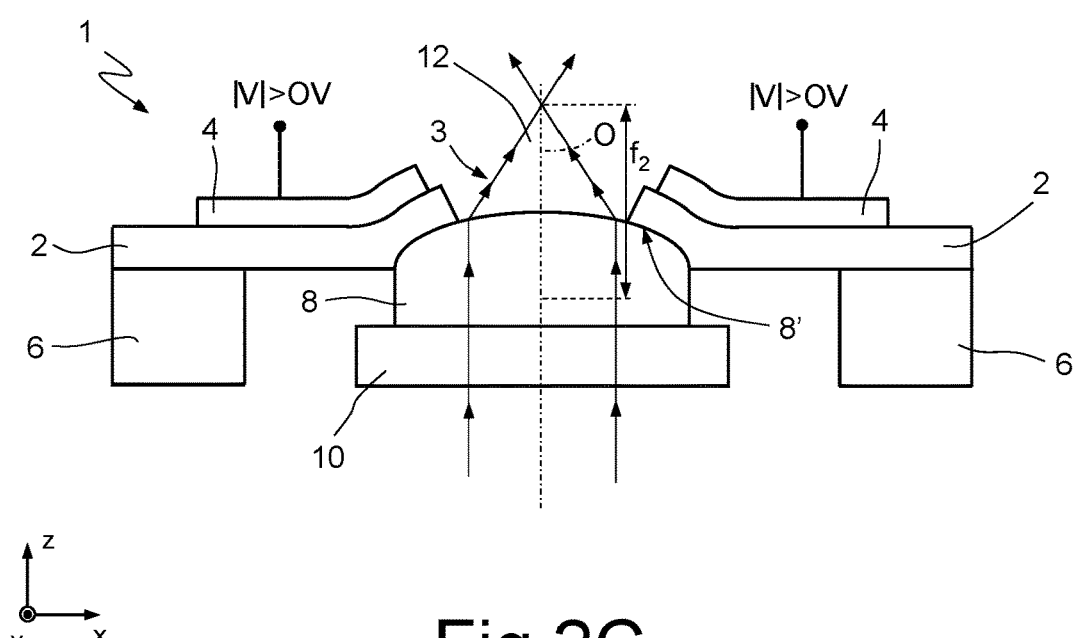

Purely by way of example, it is assumed that the MEMS device 21 is such that, when the voltage values $V_{ext}$ and $V_{int}$ are zero, the residual tensile stress is such that the membrane 26 is curved upwards in a similar way to what is shown in FIG. 2B. It is also assumed that, purely by way of example, voltage values $V_{ext}$ and $V_{int}$, equal to 0 V and 5 V respectively, are applied in order to obtain the operating condition shown in FIG. 5A. Thus a downward curvature of the membrane 26 is forced, while the pre-existing curvature is cancelled out. In this context, the applicant has observed that the greater tensile stress in the portion of the membrane 26 under the inner actuator 38 causes the aforementioned downward curvature of the membrane 26, owing to the constraint due to the presence of the projecting region 40. The applicant has also observed that, in the absence of the projecting region 40, the absolute increase in the voltage $V_{int}$ would, on the contrary, cause an upward curvature of the membrane 26.

On the other hand, FIG. 5B shows a situation in which the outer piezoelectric region 36 is biased with a voltage signal with a value of $V_{ext}$', having an absolute value greater than the absolute value of $V_{ext}$, equal to 10 V for example, while the inner piezoelectric region 38 is biased with the same voltage signal with a value of $V_{int}$ as that used in the operating condition of FIG. 5A.

The greater tensile stress in the part of the membrane 26 underlying the outer piezoelectric region 36, due to the increase in absolute value of the voltage applied to the outer piezoelectric region 36, causes an upward curvature of the membrane 26. In practice, the applicant has found that the projecting region 40 under the inner piezoelectric region 38 makes it possible to invert the direction of deflection of the membrane 26 relative to that which can be obtained with only the outer piezoelectric region 36 present.

On the other hand, FIG. 5C shows a situation in which the inner piezoelectric region 38 is biased with a voltage signal with a value of $V_{int}$', for example 25 V, having an absolute value greater than the absolute value of $V_{int}$, while the outer piezoelectric region 36 is biased with the same voltage signal with a value of $V_{ext}$ as that used in the operating condition of FIG. 5A. Thus the downward curvature of the membrane 26 is accentuated.

In practice, the outer actuator 36, the inner actuator 38 and the projecting region 40 form a bimorphous actuator, although this is formed of unimorphous piezoelectric material. Thus, by adjusting the values of the voltages $V_{int}$ and $V_{ext}$, the membrane 26 can be given a desired curvature, independently of the presence of any residual curvature at the end of the manufacturing process.

In other words, the piezoelectrically actuated MEMS device 21 provides precise control of the initial curvature of the membrane 26 and the possibility of curving the membrane 26 in opposite directions, in a controlled way.

Figure 6A:
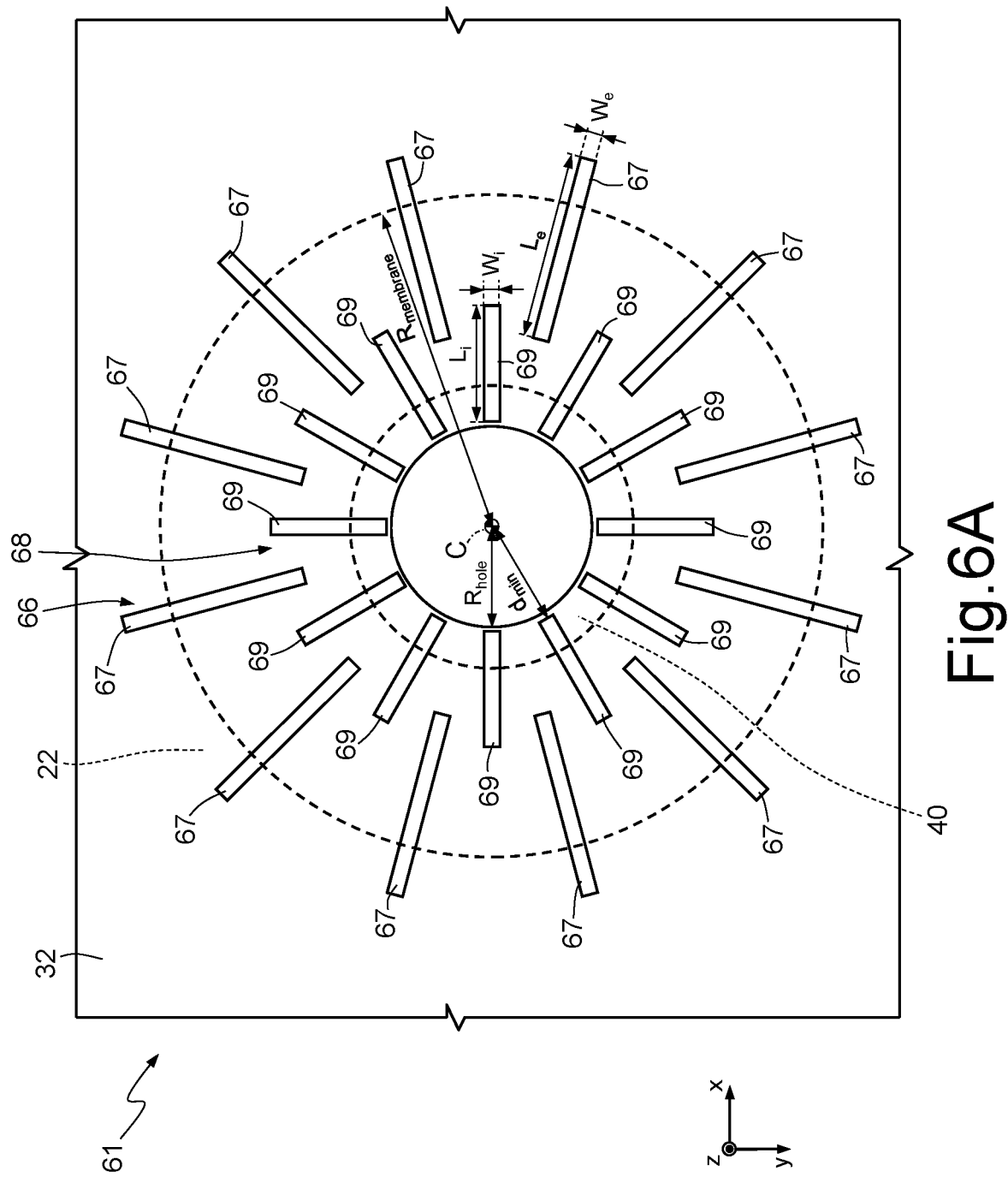
FIG. 6A shows schematically, and not to scale, in a view from above with portions removed, a MEMS device according to a further embodiment.
Figure 6B:
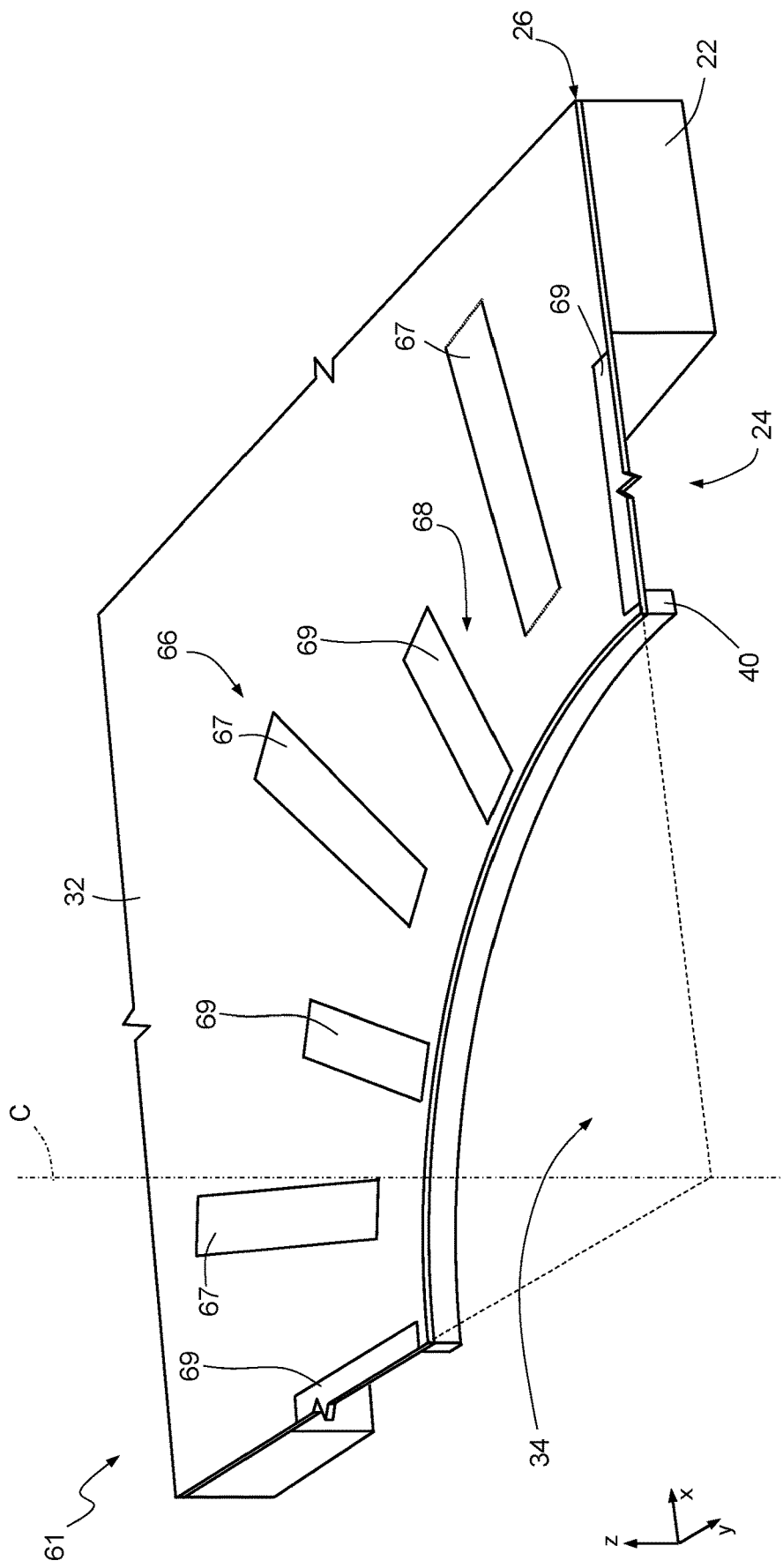
FIG. 6B shows a perspective view from above of a portion of the MEMS device of FIG. 6A.

FIGS. 6A and 6B show a MEMS device 61 according to another embodiment. In particular, FIG. 6B shows a quarter of the MEMS device 61. The MEMS device 61 of FIGS. 6A-6B is described below solely in terms of the differences from the MEMS device 21 of FIGS. 3A-3C; additionally, common elements are indicated by the same reference numerals unless specified otherwise.

In detail, the MEMS device 61 comprises an outer actuation system 66 and an inner actuation system 68.

Without any loss of generality, the inner actuation system 68 comprises twelve inner actuators, each of which corresponds to a respective inner piezoelectric region, indicated here by 69, formed of PZT, for example; the outer actuation system 66 comprises twelve outer actuators, each of which corresponds to a respective outer piezoelectric region, indicated here by 67, formed of PZT, for example.

The inner piezoelectric regions 69 take the form of a parallelepiped, having a thickness (measured parallel to the axis z) of between 0.01 µm and 10 µm for example, a length $L_i$ of between 0.05 µm and 10 mm for example, and a width $W_i$ of between 1 µm and 2 mm for example, where the length $L_i$ is measured along the main direction of extension of the parallelepiped.

The outer piezoelectric regions 67 take the form of a parallelepiped, having a thickness (measured parallel to the axis z) of between 0.01 µm and 10 µm for example, a length $L_e$ of between 0.5 µm and 10 mm for example, and a width $W_e$ of between 1 µm and 2 mm for example, where the length $L_e$ is measured along the main direction of extension of the parallelepiped.

The inner piezoelectric regions 69 are radially equidistant from the axis of symmetry C and spaced at equal angular intervals. Pairs of inner piezoelectric regions 69 therefore have an angular spacing of 30°.

The outer piezoelectric regions 67 are radially equidistant from the axis of symmetry C and spaced at equal angular intervals. Pairs of outer piezoelectric regions 67 therefore have an angular spacing of 30°.

The angular distributions of the inner and outer piezoelectric regions 69, 67 are angularly offset by 15° from one another, so that the inner and outer piezoelectric regions 69, 67 extend at a distance from one another. In other words, the inner piezoelectric regions 69 are angularly interdigitated between the outer piezoelectric regions 67.

The radial distance between the inner piezoelectric regions 69 and the axis of symmetry C is smaller than the radial distance between the axis of symmetry C and the outer piezoelectric regions 67.

In detail, for any inner piezoelectric region 69 there is a corresponding plane which contains the axis of symmetry C and which is such that the inner piezoelectric region 69 is symmetrical with respect to this plane. Additionally, in a cross section of the MEMS device 61 taken in the aforementioned plane, the inner piezoelectric region 69 overlaps the projecting region 40 by a length equal to the aforementioned length OVR2. The projecting region 40 also projects laterally with respect to the inner piezoelectric region 69 towards the axis of symmetry C.

For any outer piezoelectric region 67, there is a corresponding plane which contains the axis of symmetry C and which is such that the outer piezoelectric region 67 is symmetrical with respect to this plane. Additionally, in a cross section of the MEMS device 61 taken in the aforementioned plane, the outer piezoelectric region 67 overlaps the support body 22 by a length equal to the aforementioned length OVR1, and also extends in the form of a cantilever with respect to the support body 22, but without overlapping the projecting region 40.

The lengths of the outer piezoelectric region 67 and the inner piezoelectric region 69 are, for example, selected in such a way that the inner piezoelectric region 69 is at a radial distance from the axis of symmetry C equal to at least a minimum distance $d_{min}$, where $d_{min}$ is, for example, equal to two thirds of the radius $R_{membrane}$ of the cavity 24.

In other embodiments, not shown in the drawings, the outer piezoelectric region 67 does not overlap the support body 22 when viewed from above.

The inner piezoelectric regions 69 may be electrically connected to a single pad (not shown in the drawings), which is used to control the whole inner actuation system 68. In another embodiment, the inner piezoelectric regions 69 are divided into groups, each group being connected to a respective pad so as to allow the independent control of the respective group of inner piezoelectric regions 69. The same considerations apply to the outer piezoelectric regions 67 of the outer actuation system 66.

The MEMS device 61 of FIGS. 6A and 6B has various advantages over the MEMS device 21 of FIGS. 3A-3C. For example, the interdigitated configuration offers greater flexibility in the design of the outer actuation system 66 and the inner actuation system 68, by comparison with the outer actuator 36 and the inner actuator 38 of the MEMS device 21. In particular, in the MEMS device 21 the lengths of the outer actuator 36 and the inner actuator 38 are limited by the following relation:

$$L_{ext}-OVR_1+L_{int}<R_{membrane}-R_{hole}$$

This limit is overcome by the interdigitated configuration of the MEMS device 61, which enables both the outer piezoelectric regions 67 and the inner piezoelectric regions 69 to be extended above the same circular ring-shaped region of the membrane 26. In other words, the minimum radial distance of the outer piezoelectric regions 67 from the axis of symmetry C may be smaller than the maximum radial distance of the outer piezoelectric regions 69.

Another advantage of the MEMS device 61 consists in the possibility of independently controlling different groups of outer piezoelectric regions 67 and/or inner piezoelectric regions 69, so as to obtain a greater degree of freedom in the deformation of the membrane.

FIG. 7 shows an optical device 71, which is similar to the MEMS device 61 of FIGS. 6A and 6B and is described solely in terms of the differences from this MEMS device 61.

In detail, in the optical device 71 the membrane, indicated here by 56, comprises a layer of silicon dioxide ($SiO_2$), having a thickness of between 0.1 µm and 50 µm for example.

The optical device 71 further comprises a microlens 72 composed of a transparent soft polymer layer, for example polydimethylsiloxane (PDMS), having a thickness of between 1 µm and 500 µm for example. The microlens 72 is mechanically coupled to the membrane 56, and extends under the membrane 56 at a distance from the support body 22. In particular, the microlens 72 extends under the whole area of the aperture 34 and around the projecting structure 40, filling the secondary cavity 39. The mechanical coupling between the membrane 56 and the microlens 72 acts in such a way that deflections of the membrane 56 due to the inner actuation system 68 and/or the outer actuation system 66 cause a deformation of the microlens 72. Thus the value of the optical correction of the microlens 72 can be modified by the voltage control of the inner actuation system 68 and/or the outer actuation system 66.

The optical device 71 further comprises a transparent support body 74, made of silicon dioxide ($SiO_2$) for example, having a thickness of between 1 μm and 500 μm for example. The transparent support body 74 is fixed to the microlens 72, and extends under the microlens 72 at a distance from the support body 22. Consequently, when the optical device 71 is in use, an optical signal, for example a beam of light parallel to the axis z, can pass through the transparent support body 74, the microlens 72 and the aperture 34. Because of the presence of the transparent support body 74, the surface of the microlens 72 fixed to the transparent support body 74 is not deformed during the use of the MEMS device 71 as a result of deformations of the membrane 56.

In another embodiment, not shown in the drawings, the outer actuation system 66 and the inner actuation system 68 may be replaced, respectively, by the outer piezoelectric region 36 and the inner piezoelectric region 38 of the MEMS device 21 shown in FIGS. 3A-3C.

The interdigitated configuration of the outer actuator 66 and the inner actuator 68 of the optical device 71 of FIG. 7 has the advantage of being able to deform the microlens 72 so as to correct optical aberrations that require deformations without cylindrical symmetry, such as astigmatism.

Figure 8:
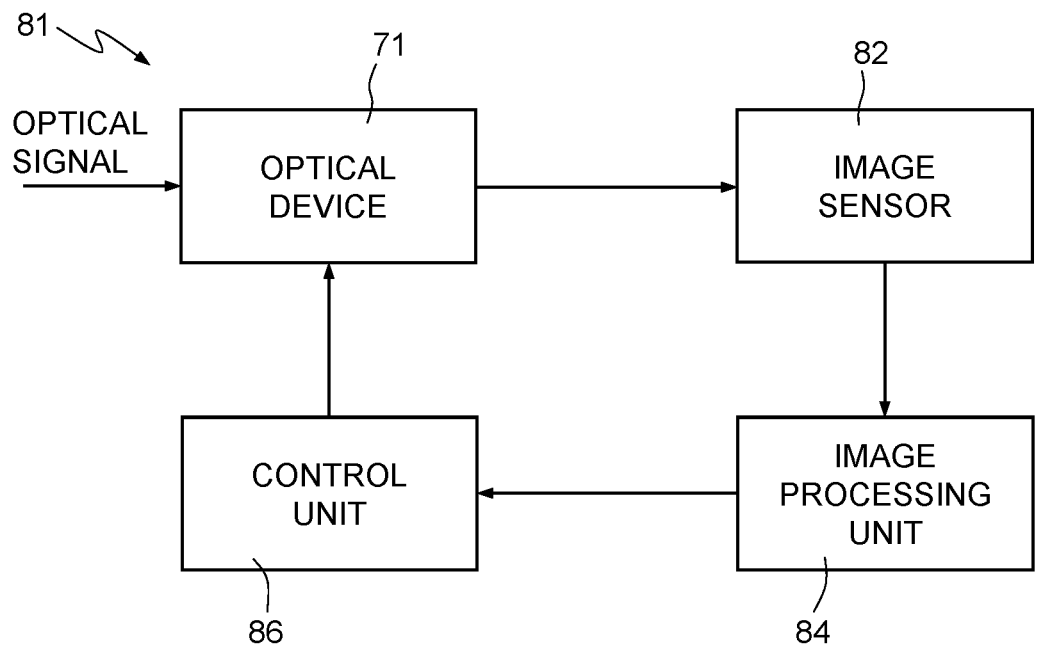
FIG. 8 shows a block diagram of an autofocus system including the optical device of FIG. 7.

FIG. 8 shows an autofocus system 81, which comprises the optical device 71; an image sensor 82 optically coupled to the optical device 71; an image processing unit 84 electrically coupled to the image sensor 82; and a control unit 86 electrically coupled to the image processing unit 84 and to the optical device 71.

The optical device 71 receives the optical signal, which passes through the microlens 72, forming an image which is detected by the image sensor 82. The image sensor 82 is, for example, a CMOS image sensor of a known type.

The image sensor 82 generates a first output signal on the basis of the aforementioned image and sends it to the image processing unit 84. The image processing unit 84 analyses, by known methods, the first output signal of the image sensor 82, and assigns a score to it on the basis of the focusing quality of the image associated with the first output signal; the image processing unit 84 also determines, by means of known autofocus algorithms, correction values of the microlens 72 for improving the focusing quality score.

The image processing unit 84 generates a second output signal, which contains the aforementioned information concerning the correction values of the microlens 72, and which is sent to the control unit 86. The control unit 86 comprises a control circuit of the optical device 71, capable of determining the voltage values $V_{ext}$ and $V_{int}$ that can control the outer actuation system 66 and the inner actuation system 68, respectively, so as to provide a deflection of the membrane 56 causing a deformation of the microlens 72 corresponding to the correction values determined by the image processing unit 84. For example, the control unit 86 may have access to a look-up table comprising a pair of voltage values ($V_{int}$, $V_{ext}$) for each correction value that can be provided by the microlens 72. The control unit 86 also biases the outer actuation system 66 to the voltage $V_{ext}$ and biases the inner actuation system 68 to the voltage $V_{int}$, by means of electrical connections (not shown in the drawings) to the pads of the optical device 71.

The optical system 81 therefore implements a feedback method which can automatically improve the image focusing quality.

The advantages of the present MEMS device are evident from the above description.

In particular, the present MEMS device makes it possible to control the curvature of the membrane in a precise way, independently of the type of residual stress of the membrane; in particular, the present MEMS device makes it possible to deflect the membrane in opposite directions, without the need to use a bimorphous material.

The interdigitated configuration of the actuators also offers a greater degree of freedom in the deformation of the membrane, for example by allowing the cylindrical symmetry to be broken.

Finally, what has been described and illustrated here can clearly be modified and varied without departure from the protective scope of the present disclosure.

Figure 9:
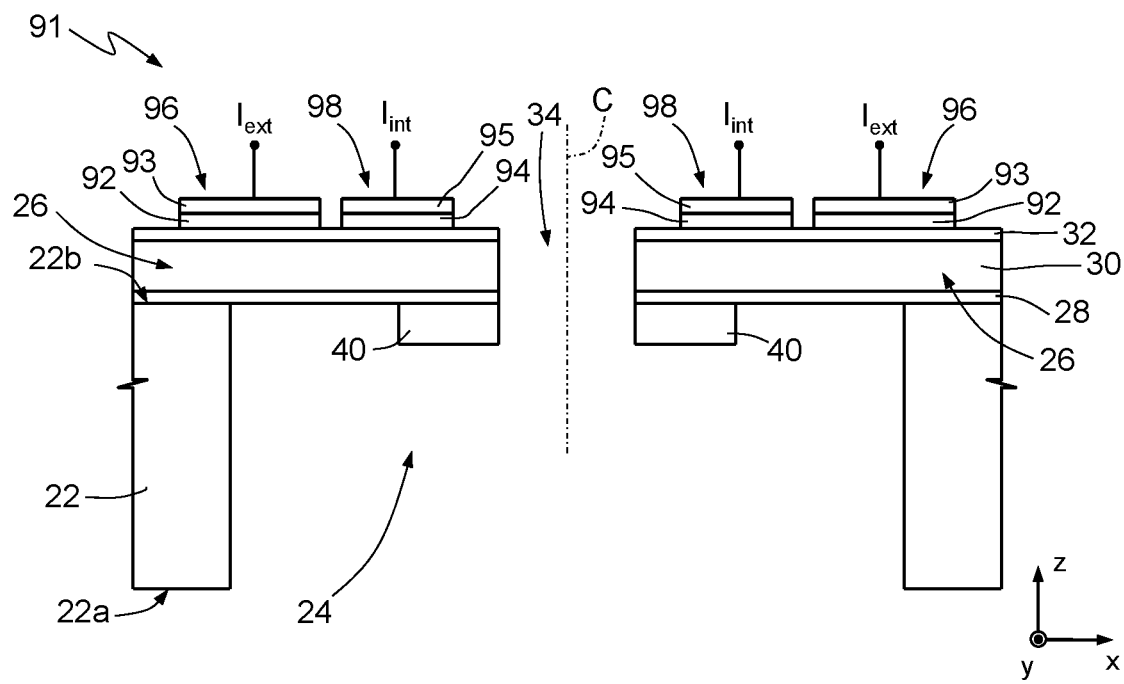
FIG. 9 shows schematically, and not to scale, with portions removed, a cross-sectional view of a MEMS device according to a further embodiment.

For example, FIG. 9 shows a MEMS device 91 according to another embodiment. The MEMS device 91 of FIG. 9 is described below solely in terms of the differences from the MEMS device 21 of FIGS. 3A-3C; additionally, common elements are indicated by the same reference numerals unless specified otherwise.

In detail, in the MEMS device 91 the outer actuator, indicated here by 96, comprises a first heat-sensitive region 92, extending above the membrane 26, to which it is mechanically coupled, and a second heat-sensitive region 93, extending above the first heat-sensitive region 92. The first heat-sensitive region 92 is made of aluminum, copper or gold, for example, and has a thickness of between 0.1 μm and 50 μm, for example; the second heat-sensitive region 93 is made of platinum, tungsten or titanium, for example, and has a thickness of between 0.1 μm and 50 μm, for example. The materials of the first heat-sensitive region 92 and the second heat-sensitive region 93 have different thermal expansion coefficients. In particular, the material of the first heat-sensitive region 92 has a higher thermal expansion coefficient than the material of the second heat-sensitive region 93.

When viewed from above, the first and the second heat-sensitive region 92, 93, partially overlap the support body 22 and extend in the form of a cantilever relative to the support body 22; the first and the second heat-sensitive region 92, 93 are also laterally offset relative to the projecting region 40, so that they do not overlap the latter.

Additionally, in the MEMS device 91 the inner actuator, indicated here by 98, comprises a third heat-sensitive region 94, extending over the membrane 26, to which it is mechanically coupled, and a fourth heat-sensitive region 95, extending over the third heat-sensitive region 94. The third heat-sensitive region 94 is made of aluminum, copper or gold, for example, and has a thickness of between 0.1 μm and 50 μm, for example; the fourth heat-sensitive region 95 is made of platinum, tungsten or titanium, for example, and has a thickness of between 0.1 μm and 50 μm, for example. The materials of the third heat-sensitive region 94 and the fourth heat-sensitive region 95 have different thermal expansion coefficients. In particular, the material of the third heat-sensitive region 94 has a higher thermal expansion coefficient than the material of the fourth heat-sensitive region 95.

When viewed from above, the third and the fourth heat-sensitive region 94, 95 partially overlap the projecting region 40.

When the MEMS device 91 is in use, the outer actuator 96 is current controlled by means of a signal $I_{ext}$, which passes through at least one of the first heat-sensitive region 92 and the second heat-sensitive region 93. The flow of current causes a rise in the temperature of the first and the second heat-sensitive region 92, 93. The different thermal expansion coefficients of the first and the second heat-sensitive region 92, 93 cause a curvature of the outer actuator 96, and consequently an upward curvature of the membrane 26, as shown in FIG. 5B for the MEMS device 21.

In use, the inner actuator 98 is current controlled by means of a signal $I_{int}$, which passes through at least one of the third heat-sensitive region 94 and the fourth heat-sensitive region 95. The flow of current causes a rise in the temperature of the third and the fourth heat-sensitive region 94, 95. The different thermal expansion coefficients of the third and the fourth heat-sensitive region 94, 95 cause a curvature of the inner actuator 98, and consequently a downward curvature of the membrane 26, as shown in FIG. 5C for the MEMS device 21.

In general, there are possible embodiments of the same type as those described with reference to FIGS. 3A-3C and 6A-6B, in which each piezoelectric region (inner or outer) is replaced by a corresponding pair of heat-sensitive regions. In this context, the geometrical relations described above with reference to the piezoelectric regions are also applicable in the case where these regions are replaced by corresponding pairs of heat-sensitive regions.

Figure 10:
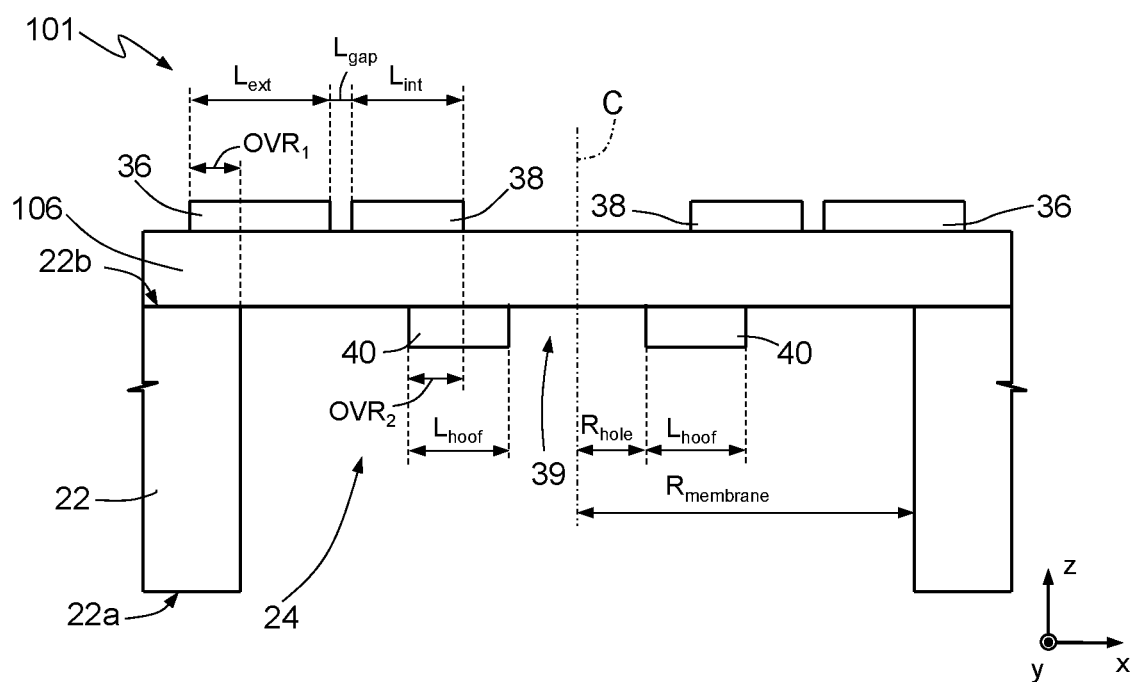
FIG. 10 shows schematically, not to scale and with portions removed, a cross-sectional view of a MEMS device according to a further embodiment.

Additionally, FIG. 10 shows a MEMS device 101 according to another embodiment. The MEMS device 101 of FIG. 10 is described below solely in terms of the differences from the MEMS device 21 of FIGS. 3A-3C; additionally, common elements are indicated by the same reference numerals unless specified otherwise.

In detail, in the MEMS device 101 the membrane, indicated here by 106, extends entirely above the cavity 24, separating the cavity 24 from the environment above the membrane 106. In other words, the membrane 106 does not have the aperture 34. Additionally, the secondary cavity 39 of the projecting region 40 has a radius of a size equal to the aforementioned radius $R_{hole}$. In this case, the membrane 106 may be formed by a single layer of material transparent in the visible range, for example silicon dioxide. Additionally, the secondary cavity 39 is delimited above by an inner part of the central portion of the membrane 106.

In general, the MEMS device 101 is suitable for forming not only optical devices, but also switching devices, for example radio frequency switches.

There are also possible embodiments of the type shown in FIG. 10, in which, however, the projecting region, when viewed from above, is simply connected; that is to say, the projecting region has no cavity.

There are also possible embodiments, not shown, in which the outer actuator, the inner actuator, the cavity, the projecting region and the aperture of the membrane have symmetries of types other than the cylindrical symmetry of the aforementioned elements in the embodiments described above. For example, there are possible embodiments in which at least one of the outer actuator, the inner actuator and the projecting region takes the form of a hollow parallelepiped, and at least one of the cavity and the aperture of the membrane takes the form of a parallelepiped.

There are also possible embodiments of the present MEMS device in which at least one of the outer actuator, the inner actuator, the projecting region, the cavity and the aperture of the membrane has no symmetry.

Figure 11:
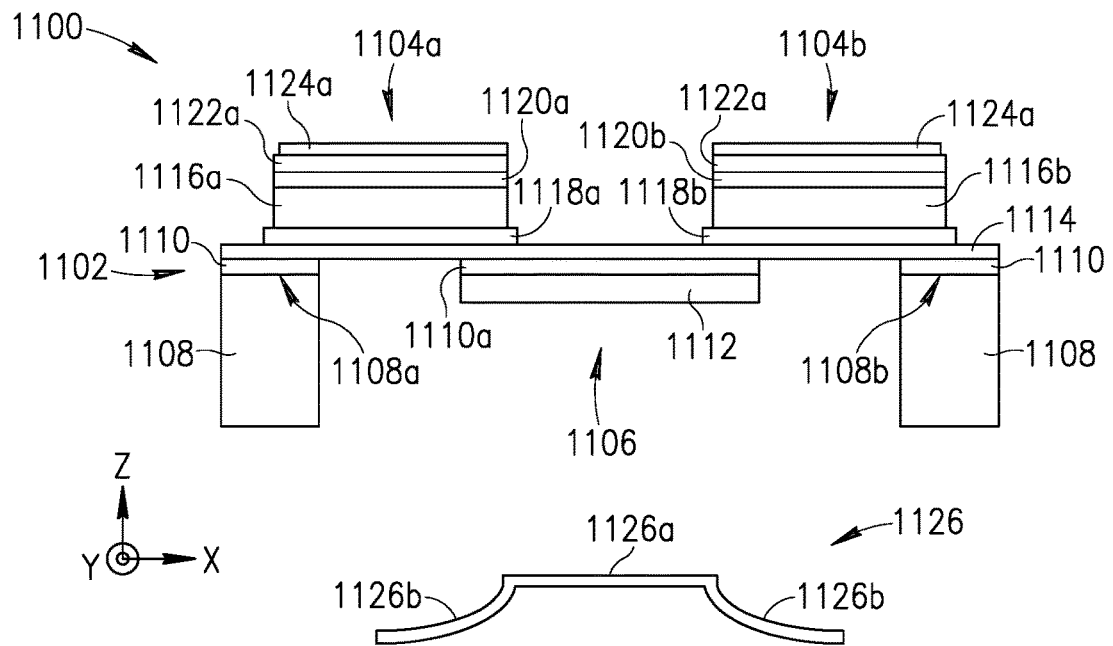
FIG. 11 is a cross-sectional view of a piezoelectric actuator including a dual-thickness membrane according to another embodiment of the present disclosure.

FIG. 11 is a cross-sectional view of a piezoelectric actuator 1100 including a dual-thickness membrane 1102 according to another embodiment of the present disclosure. In operation, the dual-thickness membrane 1102 provides increased movement or deflection of the membrane without requiring an increase in the size of or voltage applied to piezoelectric actuators 1104a, 1104b, as will be described in more detail below. In the piezoelectric actuator 1100, the membrane 1102 extends over an aperture or cavity 1106 in a support body 1108, with peripheral portions of the membrane being attached to a surface 1108a of the support body. Thus, a central portion of the membrane 1102 extends over the cavity 1106 with the peripheral portions of the membrane being attached or fixed to the surface 1108a of the support body 1108a. The actuators 1104a, 1104b deform the membrane 1102 in an up-down direction parallel to a Z-axis as indicated by the XYZ axes shown in the embodiment of FIG. 11, as will be described in more detail below.

The dual-thickness membrane 1102 includes a first dielectric layer 1110 formed on the upper surface 1108a of the support body 1108, with portions of the first dielectric layer over the cavity 1106 being removed and a center portion 1110a of the first dielectric layer remaining in the center of the cavity in the XY-plane as indicated by the XYZ axes. In addition, the dual-thickness membrane 1102 includes a first structural layer 1112 formed on the center portion 1110a of the first dielectric layer 1110 and a second structural layer 1114 formed on a surface of the first dielectric layer opposite the cavity 1106. In this way, the dual-thickness membrane 1102 extending over the cavity 1106 has two thicknesses in a direction parallel to the Z-axis, namely a first thickness corresponding to a thickness of the first structural layer 1112 and the center portion 1110a of dielectric layer 1110 and a second thickness corresponding to a thickness of the second structural layer 1114. The second thickness is greater than the first thickness.

The piezoelectric actuators 1104a, 1104b are formed spaced apart on the surface of the second structural layer 1114 opposite the cavity 1106. Each of the piezoelectric actuators 1104a, 1104b includes a piezoelectric stack having a corresponding first piezoelectric layer 1116a, 1116b positioned between a pair of electrodes 1118a, 1118b and 1120a, 1120b as illustrated. Second piezoelectric layers 1122a, 1122b are formed on the electrodes 1120a, 1120b and third electrodes 1124a, 1124b formed on these second piezoelectric layers. The actuators 1104a, 1104b are positioned over the thinner portions of the membrane 1102, namely over the portions of the second structural layer 1114 having the second thickness. Thus, in the embodiment of FIG. 11, the electrodes 1118a, 1118b are formed on the surface of the second structural layer 1114 opposite the cavity 1106 and extending in a direction parallel to the X-axis partially over the support body 1108 on one end and partially over on the first structural layer 1112 on a second end opposite the first end.

Figure 12:
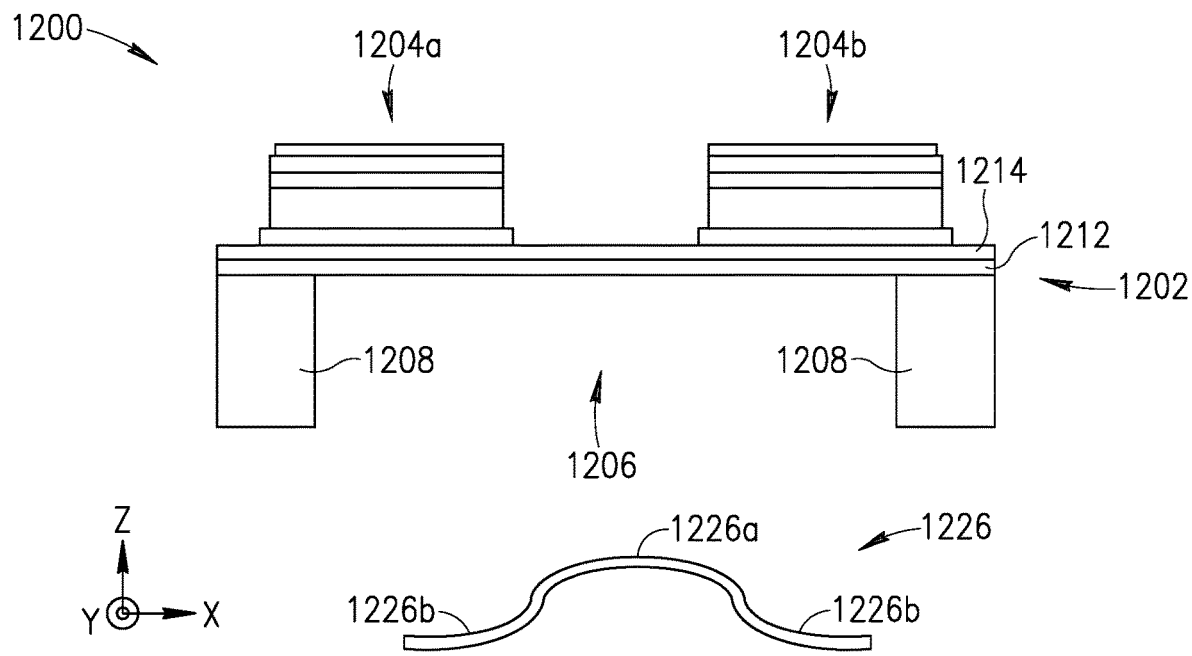
FIG. 12 is cross-sectional view illustrating the structure of a conventional piezoelectric actuator for comparison to the actuator structure of FIG. 11.

In operation, suitable voltage signals are applied to the electrodes 1118, 1120, 1124 of the piezoelectric actuators 1104a, 1104b to induce tensile stresses on the piezoelectric regions 1116, 1122 and thereby cause a deflection or movement or deformation of the membrane 1102 in a manner similar to the operation of the MEMS device 21 of FIGS. 3-5, as will be appreciated by those skilled in the art. Due to the presence of the first structural layer 1112 providing the membrane 1102 with a second thickness that is greater than the first thickness of the membrane, the deformation of the membrane caused by the piezoelectric actuators 1104a, 1104b is different than for a uniform thickness membrane as shown in FIG. 12.

A deflection profile of the membrane 1102 of the actuator 1100 of FIG. 11 along a direction parallel to the X-axis is illustrated through a graph 1126 shown under the cross-sectional view of the actuator. This deflection profile 1126 illustrates deflection of the membrane 1102 in a direction parallel to the Z-axis along the length of the membrane parallel to the X-axis. Due to the second thickness of the membrane 1102 provided by the first structural layer 1112, the deflection parallel to the Z-axis of the middle portion of the membrane between the actuators 1104a, 1104b, is reduced. This is illustrated in a center portion 1126a of the deflection profile graph 1126. In contrast, the thinner first thickness of the membrane 1102 under the piezoelectric actuators 1104a, 1104b results in a greater deflection of the membrane in peripheral portions of the membrane to the left and right of the middle portion, which are labelled as portions 1126b in the graph 1126.

This deflection profile of the membrane 1102 having a larger deflection or movement of the membrane 1102 in the peripheral portions of the membrane provides a larger portion or area of membrane that experiences this larger movement, improving the performance of the actuator 1100. For example, where the actuator 1100 is utilized in a fluidic pump, the actuator 1100 can move a larger volume of a fluid due to the deflection profile of the membrane 1102. This is in contrast to a conventional actuator 1200 including a unitary thickness membrane 1202 as shown in FIG. 12. Selected components of this conventional actuator 1200 have been labelled with numbers 1202-1226 corresponding to similar components 1102-1126 in the actuator 1100 for purposes of comparing the two structures. A deflection profile 1226 shows that in this conventional actuator 1200, the central portion of the membrane 1202 is deflected the most by actuators 1204a, 1204b while the peripheral portions of the membrane are deflected less. This deflection results in a smaller area of the overall membrane 1202, namely the central portion of the membrane between the actuators 1204a, 1204b, being deflected through a greater distance, which reduces the overall efficiency or performance of the actuator 1200 relative to the actuator 1100 having the dual-thickness membrane 1102. To increase the deflection of the membrane 1202, increased voltage levels could be applied to the actuators 1204a, 1204b but such increased voltages may be harmful to other components (not shown) coupled to the actuator 1200. Another option to increase the deflection of the membrane 1202 would be to increase the size of the piezoelectric actuators 1204a, 1204b, but this solution results in a larger overall actuator 1200 and in addition, because the piezoelectric material in these actuators is typically lead zirconate titanate (PZT), increasing the size of these actuators is undesirable in that increasing the size results in the overall actuator containing more lead, which is a potentially hazardous compound upon disposal of a device containing the actuator.

Figure 13A:
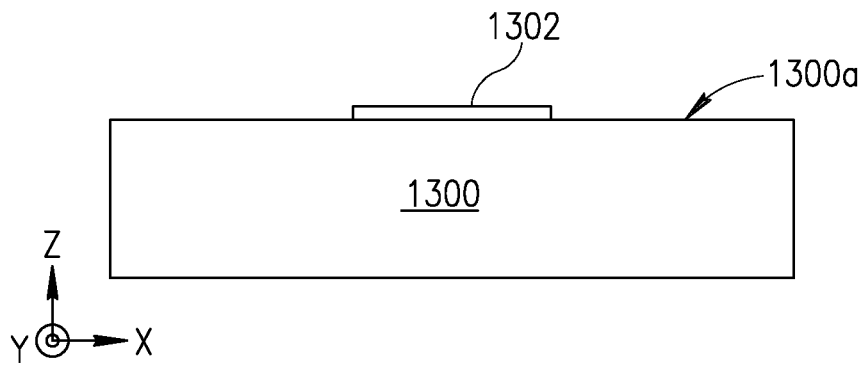
FIGS. 13A-13G illustrate a process of fabricating a piezoelectric actuator having a structure similar to the actuator of FIG. 11 according to an embodiment of the present disclosure.
Figure 13B:
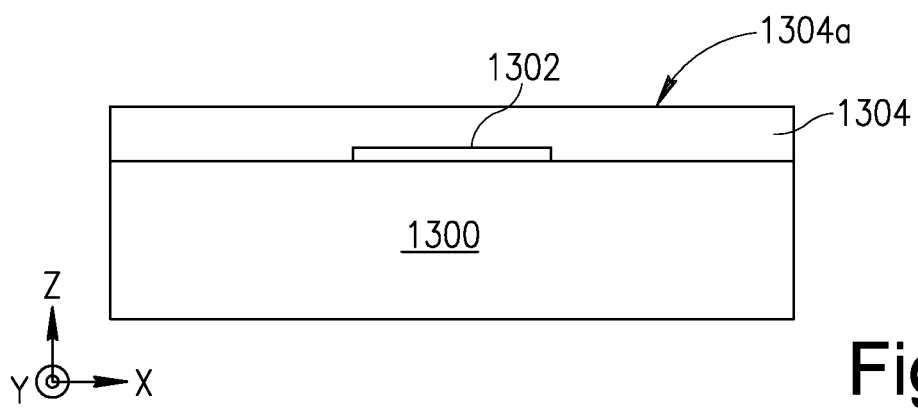

FIGS. 13A-13G illustrate a process of fabricating a piezoelectric actuator having a structure the same as or similar to the actuator 1100 of FIG. 11 according to an embodiment of the present disclosure. The process begins in FIG. 13A with a bulk silicon substrate 1300 having a surface 1300a. In a first step of the process, a first etch stop layer 1302 is formed on the surface 1300a through a suitable process. The first etch stop layer 1320 functions as a stop layer for subsequent silicon etching of the silicon substrate 1300, as will be described in more detail below. In embodiments of the present disclosure, the first etch stop layer 1320 is a thermal oxide layer or a silicon dioxide layer deposited using a tetraethyl orthosilicate (TEOS) source. After formation of the first etch stop layer 1302, a first epitaxial layer 1304 is formed over the first etch stop layer 1302 and on the surface 1300a of the substrate 1300 as shown in FIG. 13B. This first epitaxial layer 1304 may be formed through any suitable technique, such as formation on the surface 1300a and first etch stop layer 1302 of a polysilicon seed layer through low-pressure chemical vapor deposition (LPCVD) followed by subsequent epitaxial growth to form the epitaxial layer. In one embodiment, the first etch stopping layer 1302 has a thickness of approximately one micrometer (μm) and the first epitaxial layer 1304 is approximately 3 micrometers (μm) thick. The thicknesses of the layers 1302, 1304 and other layers discussed below is in a direction parallel to the Z-axis shown in FIGS. 13A-13G.

Figure 13C:
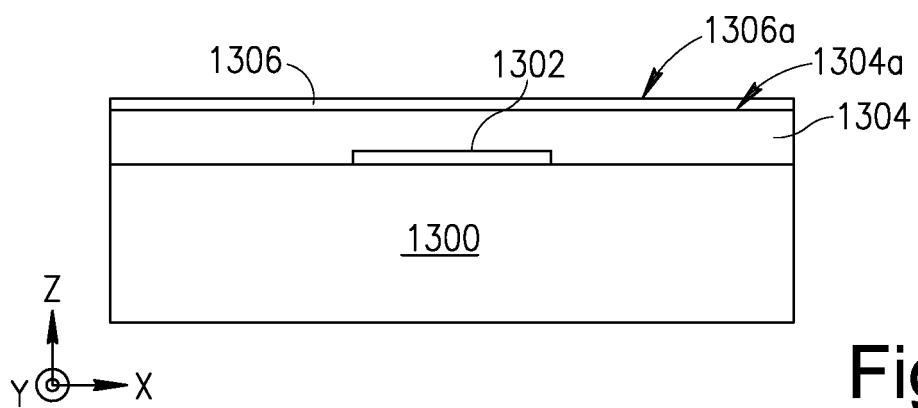
Figure 13D:
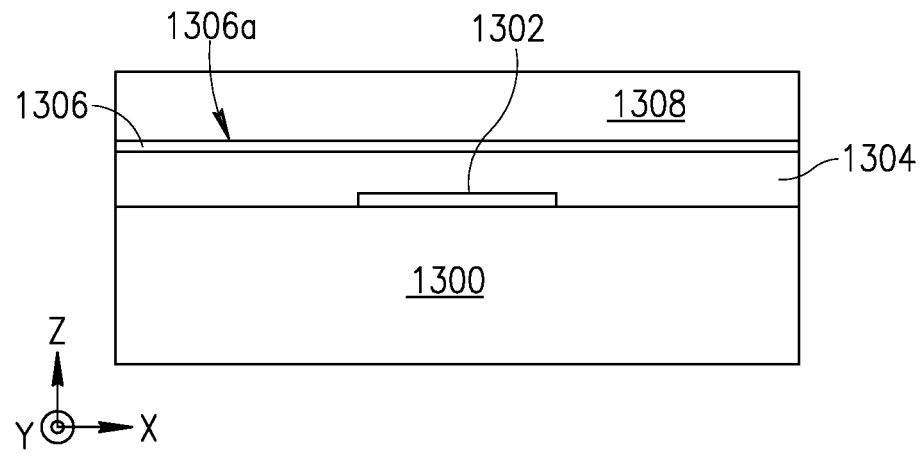

After formation of the epitaxial layer 1304 in FIG. 13B, a second etch stop layer 1306 is formed on a surface 1304a of the first epitaxial layer 1304 as shown in FIG. 13C. The second etch stop layer 1306 may be formed from any suitable material and through any suitable process and functions as a stop layer for the subsequent silicon etch of the silicon substrate 1300, as we described in more detail below. The second etch stop layer 1306 may be a thermal oxide layer or a silicon dioxide layer deposited using a TEOS source. The second etch stop layer 1306 is also approximately one micrometer thick in embodiments of the present disclosure. After formation of the second etch stop layer 1306, a second epitaxial layer 1308 is formed on a surface 1306a of the second etch stop layer 1306 as shown in FIG. 13D. This second epitaxial layer 1308 may be formed through any suitable technique, such as formation on the surface 1306a of a polysilicon seed layer through low-pressure chemical vapor deposition (LPCVD) followed by subsequent epitaxial growth to form the epitaxial layer. In one embodiment, the second epitaxial layer 1308 is approximately six micrometers thick.

Figure 13E:
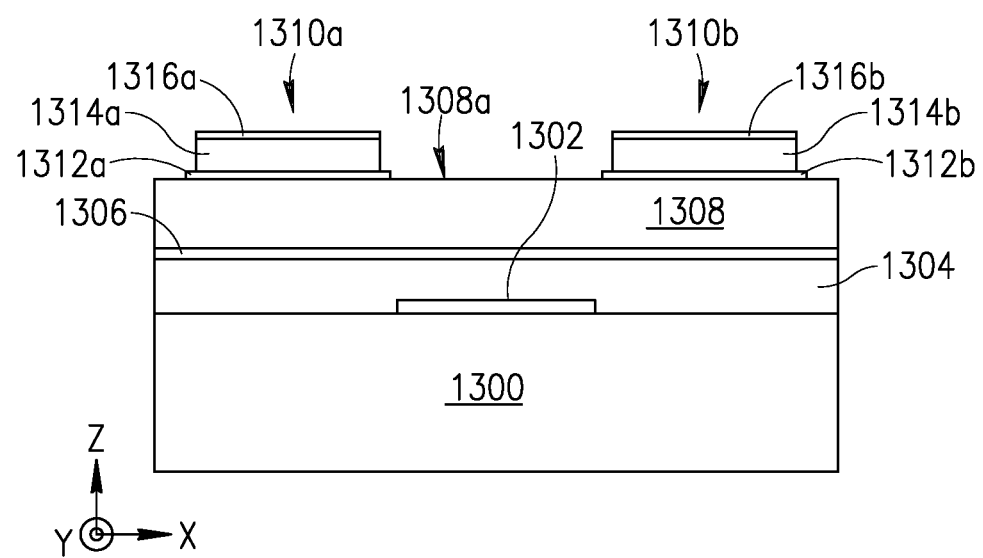
Figure 13F:
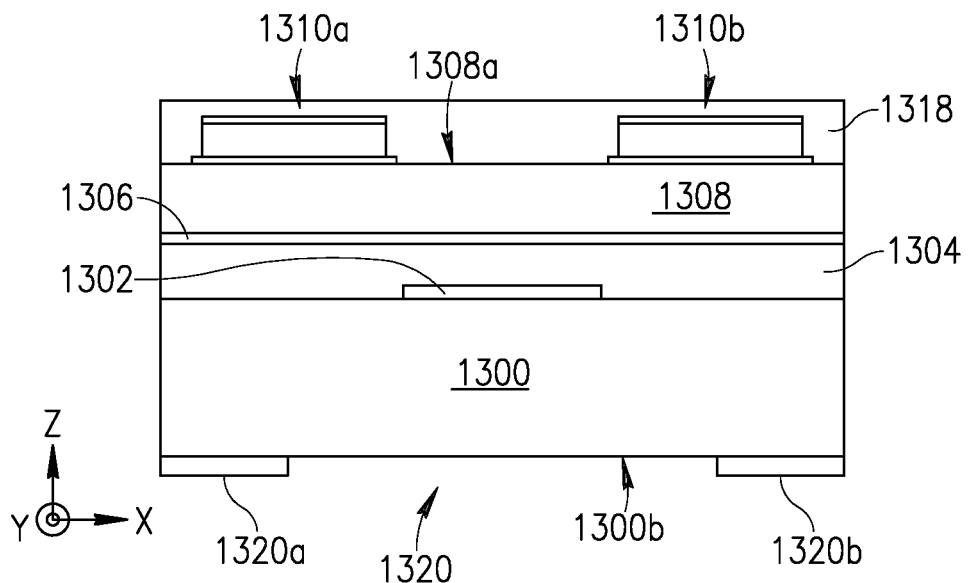

Upon formation of the second epitaxial layer 1308, piezoelectric electric stacks forming piezoelectric actuators 1310a, 1310b are formed on a surface 1308a of the second epitaxial layer as shown in FIG. 13E. Each piezoelectric actuator 1310a, 1310b includes a first electrode 1312a, 1312b formed on the surface 1308a, a piezoelectric layer 1314a, 1314b formed on the first electrode 1312a, 1312b, and a second electrode 1316a, 1316b formed on the piezoelectric layers 1314a, 1314b. After formation of the piezoelectric actuators 1310a, 1310b, a passivation layer 1318 is formed over the piezoelectric actuators and the surface 1308a of the second epitaxial layer 1308 as shown in FIG. 13F. In addition, a suitable mask 1320, such as a photoresist, is formed on a surface 1300b of the substrate 1300 and patterned to allow for the formation of a cavity in the substrate and first epitaxial layer 1304. More specifically, the mask 1320 includes portions 1320a, 1320b with openings in the mask between these portions to expose the surface 1300b of the substrate 1300 for formation of the cavity, as will be described in more detail with reference to FIG. 13G.

Figure 13G:
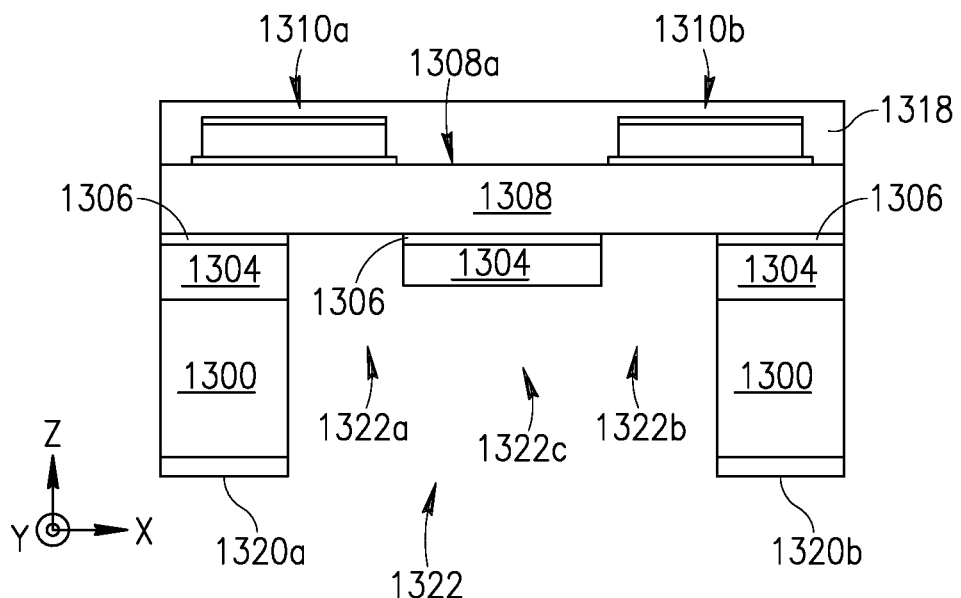

In FIG. 13G, an etching step is performed to form a cavity 1322 that provides the actuator with a dual-thickness membrane formed by the second epitaxial layer 1308 and a remaining portion of the first epitaxial layer 1304 between the piezoelectric actuators 1310a, 1310b, as will now be described in more detail. The etching step includes a suitable dry etching operation that removes the portions of the substrate 1300 exposed through the mask 1320 and also removes portions the first epitaxial layer 1304. This dry etching operation forms a cavity 1322 as shown in FIG. 13G, with the cavity including portions 1322a and 1322b on the left and right that also extend through the first epitaxial layer 1304. The dry etching operation removes the first epitaxial layer 1304 up until the second etch stop layer 1306.

In the embodiment of FIG. 13G, after this dry etching operation the etching step includes a wet etching operation that removes the exposed portions of the second etch stop layer 1306 in the portions 1322a, 1322b of the cavity 1322. This wet etch operation also removes the first etch second stop layer 1302 in a center portion 1322c of the cavity 1322 because typically both the first and second etch stop layers are oxides. The wet etch operation is optional. If not performed, each of the portions 1322a, 1322b of the cavity 1322 would include an exposed portion of the second etch stop layer 1306 and the first etch stop layer 1302 in the center portion 1322c of the cavity. During the dry etching operation, the first etch stop layer 1302 prevents removal of the first epitaxial layer 1304 in the center portion 1322c of the cavity 1322 as seen in FIG. 13G. In this way, this remaining portion of the first epitaxial layer 1304 in the center portion 1322c provides a thicker portion of the membrane of the actuator being formed, where the membrane corresponds to the second epitaxial layer 1308, second etch stop layer 1306, remaining portion of the first epitaxial layer 1304 in the center portion 1322c, and the first etch stop layer 1302 on this remaining portion of the first epitaxial layer.

In another embodiment of the process of FIGS. 13A-G, instead of layer 1308 being a second epitaxial layer, a thick oxide layer may instead be utilized in place of the second epitaxial layer. In this way, this thick oxide layer would not be etched during the silicon dry etching operation discussed above with reference to FIG. 13G. A still further embodiment could utilize the structure of FIG. 12 with the addition of a suitable structure attached to the bottom of the membrane 1202 in the middle of the cavity 1206 between the piezoelectric actuators 1204a, 1204b to realize a structure similar to that of FIG. 11. In yet another embodiment, a thick electroplated layer could be grown in the center of the membrane 1102 of FIG. 11 to provide the membrane with a second thickness in the center of the membrane.

Figure 14:
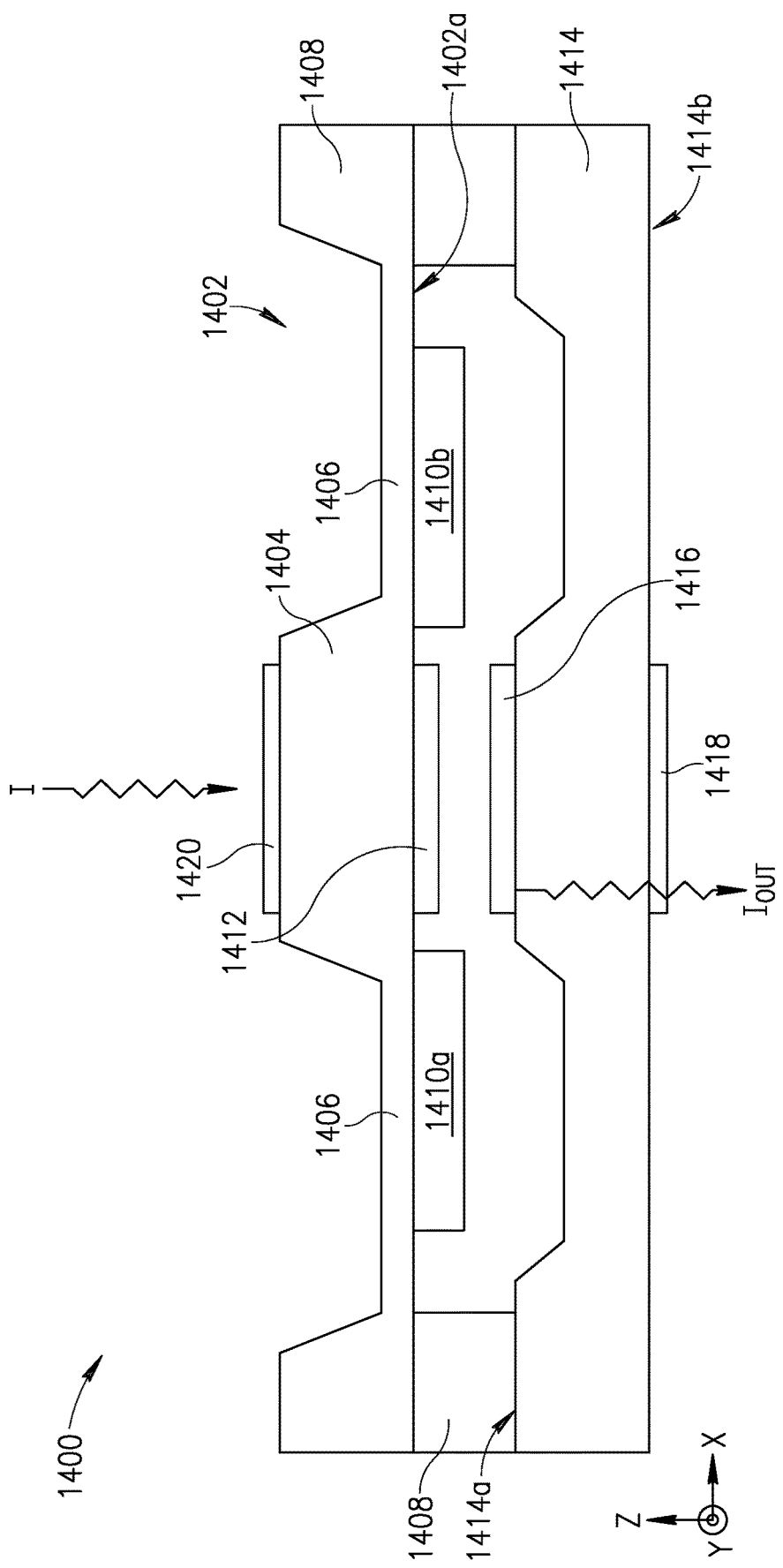
FIG. 14 is a simplified cross-sectional view of a Fabry-Perot interferometer including the piezoelectric actuator of FIG. 11 according to another embodiment of the present disclosure.

Actuators formed according to embodiments of the present application may be utilized in a variety of different applications, such as micro-pumps, ink-jet pumps, piezoelectric micromachined ultrasonic transducers (PMUT), and speakers. One application for the dual-thickness actuator 1100 of FIG. 11 and the dual-thickness actuator formed according to the process of FIGS. 13A-13G is in a Fabry-Perot interferometer as shown, an of which is shown in FIG. 14. As will be understood by those skilled in the art, in a Fabry-Perot interferometer a distance between a pair of parallel mirrors is adjusted to determine frequency components or wavelengths of an input signal supplied to the interferometer. In the simplified cross-sectional view of FIG. 14, a Fabry-Perot interferometer 1400 includes a membrane 1402 including a movable center portion 1404 suspended through a support structure 1406 to a support frame 1408. The movable center portion 1404 has a thickness parallel to the Z-axis that is thicker than a thickness of the support structure 1406. Piezoelectric actuators 1410a, 1410b are formed on a surface 1402a of membrane 1402 and extend over the thinner support structure 1406 of the membrane. Also formed on the surface 1400a of the moveable center portion 1404 is a first reflective layer 1412. A transmission structure 1414 is coupled to the support frame 1408 and includes a surface 1414a opposite the surface 1402a of the membrane 1402. A second reflective layer 1416 is formed on the surface 1414a opposite the first reflective layer 1412 and an anti-reflective coating layer formed on a surface 1414b of the transmission structure opposite the second reflective layer 1416. An anti-reflective layer 1420 is also formed on a surface of the movable center portion 1404 opposite the first reflective layer 1412.

The theory of operation of Fabry-Perot interferometers is well understood by those skilled in the art and will only briefly be described to illustrate the operation of the piezoelectric actuators 1410a, 1410b in the interferometer 1400. In operation, the piezoelectric actuators 1410a, 1410b are controlled to cause the membrane 1402 to deform and thereby vary a distance parallel to the Z-axis between the first and second reflective layers 1412, 1416. An incident electromagnetic signal I containing a plurality frequencies or wavelengths propagates downward in FIG. 14 in a direction parallel to the Z-axis. The signal I may be an infrared signal, for example, and the movable center portion 1404 may be silicon, which is transparent to infrared signals. The signal I propagates through the anti-reflective layer 1420 and moveable center portion 1404 and is incident upon the first reflective layer 1412. A portion of this incident signal I on the first reflective layer 1412 propagates through the first reflective layer and then propagates downward and is reflected by the second reflective layer 1416. This results in standing waves being generated between the reflective layers 1412, 1416 as a function of a distance (parallel to the Z-axis) between the reflective layers 1412, 1416 and the frequencies or wavelengths contained in the signal I. The distance between the reflective layers 1412, 1416 is controlled by the actuators 1410a, 1410b and, depending on the frequencies or wavelengths present in the signal I, standing waves will be generated between the reflective layers for certain distances between these layers. When the distance between the reflective surfaces 1412 is an integral multiple of a wavelength contained in the signal I, large standing waves between the reflective surfaces 1412 1416 result in an output signal Iout propagating through the reflective surface 1416 and then through anti-reflective layer 1418 as the output of the interferometer 1400. In this way, the piezoelectric actuators 1410a, 1410b are controlled to vary the distance between the reflective surfaces 1412, 1416 and the output signal Tout sensed to detect the wavelengths present in the signal I.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
    a support defining a cavity having a central axis;
    a membrane coupled to a first surface of the support and having a first portion extending over the cavity;
    a projection region extending from a first surface of the membrane into the cavity;
    a first actuator positioned on a second surface of the membrane opposite the first surface of the membrane; and a second actuator positioned on the second surface of the membrane further from the central axis than the first actuator and surrounding the first actuator and the projection region.

2. The device of claim 1, wherein the first and second actuators are collectively configured to deflect the membrane in either a first direction or a second direction responsive to a voltage applied between the first and second actuators.

3. The device of claim 2, wherein the first and second actuators include a piezoelectric material.

4. The device of claim 1, wherein the second actuator is positioned on the second surface of the membrane partially over the support and partially over the cavity.

5. The device of claim 4, wherein the first actuator is positioned on the second surface of the membrane entirely over the cavity.

6. The device of claim 1, wherein the membrane includes an aperture coaxial with the central axis.

7. The device of claim 6, further comprising a lens coupled to the membrane and positioned receive light through the aperture or to pass light through the aperture.

8. The device of claim 7, wherein the first and second actuators are configured to adjust a focal length of the lens by deflecting the membrane responsive to a voltage applied between the first and second actuators.

9. The device of claim 1, wherein the first actuator surrounds the central axis.

10. A device, comprising:
a support;
a cavity in the support having a central axis;
a membrane coupled to a first surface of the support and having a first portion extending over the cavity;
a projection region protruding from a first surface of the membrane into the cavity;
a first actuator positioned on a second surface of the membrane over the cavity; and
a second actuator positioned on the second surface of the membrane partially over the support and partially over the cavity, the second actuator further from the central axis than the first actuator.

11. The device of claim 10, further comprising a plurality of additional second actuators each positioned on the second surface of the membrane partially over the support and partially over the cavity.

12. The device of claim 11, wherein each second actuator is further from the central axis than is the first actuator.

13. The device of claim 10, further comprising a plurality of additional first actuators each positioned on the second surface of the membrane over the cavity and overlapping the projection region.

14. The device of claim 13, wherein the cavity has a central axis, wherein each first actuator is closer to the central axis than is the second actuator.

15. The device of claim 10, wherein the first and second actuators are circular.

16. The device of claim 15, wherein the second actuator surrounds the first actuator.

17. A system, comprising:
a MEMS device including:
a support defining a cavity having a central axis;
a membrane coupled to a first surface of the support and having a portion extending over the cavity;
a projection region extending from a first surface of the membrane into the cavity;
a first actuator positioned on a second surface of the membrane opposite the first surface of the membrane;
a second actuator positioned on the second surface of the membrane further from the central axis than the first actuator and surrounding the first actuator; and
a lens coupled to the membrane;
an image sensor configured to receive an optical signal from the lens and to generate a first output signal based on the optical signal.

18. The system of claim 17, further comprising an image processing unit coupled to the image sensor and configured to receive the output signal and to generate a second output signal based on the first output signal.

19. The system of claim 18, further comprising a control unit coupled to the image processing unit and to the MEMS device and configured to control the first and second actuators to adjust a focusing characteristic of the lens responsive to the second output signal.

20. The system of claim 19, wherein the focusing characteristic is a focal length of the lens.

* * * * *